United States Patent
Sekido

(10) Patent No.: US 10,200,045 B2
(45) Date of Patent: Feb. 5, 2019

(54) SPREAD SPECTRUM CLOCK GENERATOR CIRCUIT

(71) Applicant: Senta Sekido, Hyogo (JP)

(72) Inventor: Senta Sekido, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 181 days.

(21) Appl. No.: 15/417,434

(22) Filed: Jan. 27, 2017

(65) Prior Publication Data

US 2017/0264303 A1    Sep. 14, 2017

(30) Foreign Application Priority Data

Mar. 14, 2016  (JP) .................................. 2016-050256
Dec. 6, 2016   (JP) .................................. 2016-236331

(51) Int. Cl.
| | |
|---|---|
| *H03K 3/84* | (2006.01) |
| *H03L 7/081* | (2006.01) |
| *H03L 7/099* | (2006.01) |
| *H03K 4/02* | (2006.01) |
| *H03K 3/01* | (2006.01) |
| *H03L 7/197* | (2006.01) |
| *H03L 7/089* | (2006.01) |
| *H03L 7/18* | (2006.01) |
| *H03K 4/06* | (2006.01) |

(52) U.S. Cl.
CPC .............. *H03L 7/081* (2013.01); *H03K 3/01* (2013.01); *H03K 4/02* (2013.01); *H03L 7/0891* (2013.01); *H03L 7/099* (2013.01); *H03L 7/0996* (2013.01); *H03L 7/0998* (2013.01); *H03L 7/18* (2013.01); *H03L 7/197* (2013.01); *H03K 4/06* (2013.01)

(58) Field of Classification Search
CPC ....... H03L 7/197; H03L 7/081; H03L 7/0998; H03L 7/0891; H03L 7/0996; H03L 7/18; H04B 15/04
USPC ............ 375/376, 130; 331/78; 327/156, 159
See application file for complete search history.

(56) References Cited

U.S. PATENT DOCUMENTS

| | | | | |
|---|---|---|---|---|
| 8,421,508 B2 * | 4/2013 | Hirai | ....................... | H03L 7/197 327/156 |
| 8,773,183 B2 * | 7/2014 | Watabe | ................... | H03L 7/081 327/147 |
| 9,742,447 B2 * | 8/2017 | Izawa | .................... | H04B 15/04 |

FOREIGN PATENT DOCUMENTS

| | | |
|---|---|---|
| JP | 2001-339580 | 12/2001 |
| JP | 2012-195826 | 10/2012 |
| JP | 2015-103895 | 6/2015 |
| JP | 2015-122644 | 7/2015 |

* cited by examiner

*Primary Examiner* — Arnold Kinkead
(74) *Attorney, Agent, or Firm* — IPUSA, PLLC

(57) ABSTRACT

A spread spectrum clock generator circuit includes a phase comparator; an oscillator to output an output clock signal; a phase selector to select one of phases equally dividing one cycle of the output clock signal, and to generate a phase shift clock signal having a rising edge in the selected phase; and a phase shift controller to control the phase selector. The phase shift controller generates a variable phase shift amount; determines the phase of the rising edge so that the cycle of the phase shift clock signal has a length changed from the cycle of the output clock signal by the variable phase shift amount added with a fixed phase shift amount; and changes a setting of an SS modulation profile if the selected phase exceeds an upper limit, falls below a lower limit, or is within the upper and lower limits.

9 Claims, 15 Drawing Sheets

SPREAD SPECTRUM CLOCK GENERATOR CIRCUIT

BACKGROUND OF THE INVENTION

1. Field of the Invention

The present disclosure relates to a spread spectrum clock generator (SSCG) circuit.

2. Description of the Related Art

In the technology field of clock generation circuits, the "spread spectrum clock generator (SSCG) circuit" has already been known to prevent generation of EMI (radiated electromagnetic interference) that has a peak at a specific frequency. The SSCG circuit slightly modulates the frequency of a clock signal (spreads the spectrum) so as to disperse the energy of EMI having a peak at a specific frequency, and to reduce the peak value.

However, conventional SSCG circuits have a problem in that they may be a source of a long cycle noise that is generated if the synchronization signal (for example, a main scanning synchronization signal) is not synchronized with the cycle of a spread spectrum modulation (an SS modulation).

As countermeasures to this problem, Patent Document 1 proposes a method for resetting an SSCG circuit every synchronization signal. However, this method may disturb the frequency just after the reset, which makes the clock unstable.

As additional countermeasures to this problem, a method has been proposed that makes the SS modulation cycle coincide with an integer multiple of the cycle of a predetermined synchronization signal, without resetting the SSCG circuit (Patent Document 2).

However, by the configuration in Patent Document 2, the SS modulation cycle error may be not removed completely, to remain to a certain extent.

SUMMARY OF THE INVENTION

According to an embodiment, a spread spectrum clock generator circuit includes a phase comparator configured to detect a phase difference between an input clock signal being a reference and a feedback signal, and to output a control voltage depending on the phase difference; a voltage-controlled oscillator configured to generate and output an output clock signal having a frequency depending on the control voltage; a phase selector configured to select one of a predetermined number of phases equally dividing one clock cycle of the output clock signal, to generate a phase shift clock signal having a rising edge in the selected phase, and to transmit the phase shift clock signal to the phase comparator as the feedback signal; and a phase shift controller configured to control the phase selector. The phase shift controller generates a second phase shift amount changing periodically within a predetermined range, calculates a shift amount by adding the second phase shift amount to a first phase shift amount being a center of the shift amount predetermined from the cycle of the output clock signal, and determines the phase of the rising edge of the phase shift clock signal to be selected by the phase selector, so as to make the cycle of the phase shift clock signal have a length changed from the cycle of the output clock signal by the shift amount. The phase selector applies a spread spectrum modulation to the output clock signal, depending on the second phase shift amount changing periodically. The phase shift controller selects the phase having been determined, and changes a setting of an SS modulation profile specifying a step time interval for changing the shift amount, and the shift amount, depending on whether a number to identify the selected phase exceeds an upper limit of the phase selection, falls below a lower limit of the phase selection, or is within the upper and lower limits of the phase selection.

DETAILED DESCRIPTION OF THE EMBODIMENTS

In the following, embodiments will be described with reference to the drawings. Note that elements having substantially the same functional configurations throughout the specification and the drawings are assigned the same reference symbols, and duplicated description may be omitted.

According to at least one embodiment in the present disclosure, it is possible to reduce generation of unpredictable long cycle noise in a spread spectrum clock generator circuit.

Figure 1:
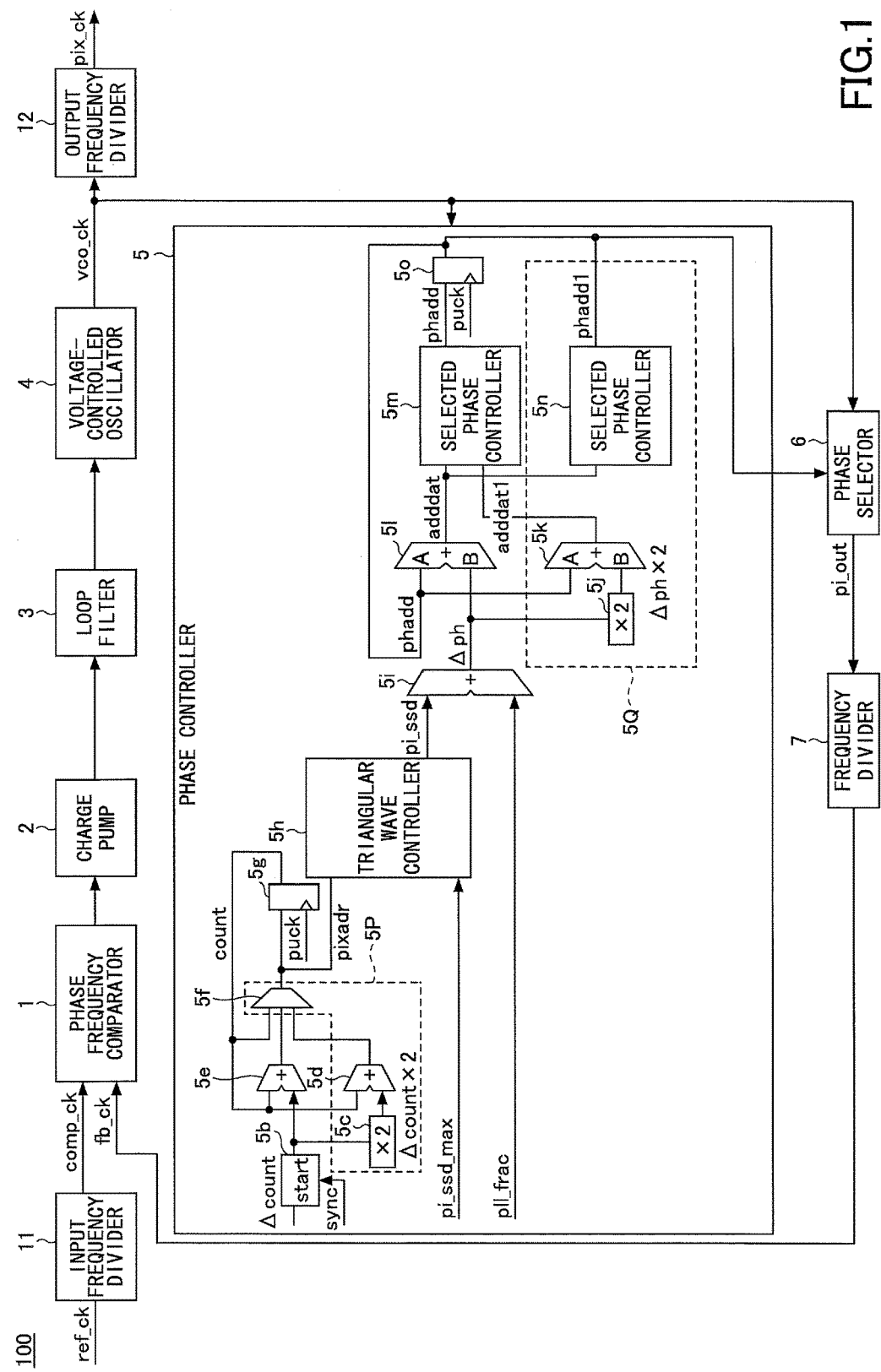
FIG. 1 is a block diagram illustrating a configuration of a spread spectrum clock generator (SSCG) circuit according to a first embodiment in the present disclosure.

FIG. 1 is a block diagram illustrating a configuration of a spread spectrum clock generator (SSCG) circuit 100 according to a first embodiment in the present disclosure. The SSCG circuit 100 in FIG. 1 is configured as a fractional PLL circuit.

A reference clock signal ref_ck, which has been generated by a reference clock generator, is divided by an input frequency divider 11, and an input clock signal comp_ck having been divided is input into a phase frequency comparator 1.

The phase frequency comparator 1 detects a phase difference between the input clock signal comp_ck and a feedback signal fb_ck, which will be described later, and outputs the phase difference to a charge pump 2. The phase frequency comparator 1 functions as a phase comparator.

The charge pump 2 increases or decreases a charge pump voltage depending on the phase difference, and outputs the voltage to a loop filter 3, and the loop filter 3 outputs a control voltage depending on the charge pump voltage to a voltage-controlled oscillator (VCO) 4.

The voltage-controlled oscillator 4 generates and outputs an output clock signal vco_ck having a frequency and a phase depending on the control voltage. The voltage-controlled oscillator 4 functions as a voltage-controlled oscillator.

An output frequency divider 12 divides the output clock signal vco_ck to be used by other circuits, and outputs it as a pixel clock signal pix_ck.

For example, an image processing apparatus is connected at the following stage of the SSCG circuit 100, and the pixel clock signal pix_ck is used by the image processing apparatus.

A feedback circuit from the voltage-controlled oscillator 4 to the phase frequency comparator 1 includes a phase selector 6 that operates under control of a phase controller 5, and a frequency divider 7 having a fixed integer division ratio.

The phase selector 6 changes the phase of the rising edge of the output clock signal vco_ck, to generate and output a phase shift clock signal pi_out having a cycle changed from the cycle of the output clock signal vco_ck. The phase selector 6 functions as a phase selector.

Here, a "phase shift" means shifting the phase at a predetermined timing, or extending or shortening the phase, and the "phase shift amount" may also be referred to as the "shift amount" to distinguish it from the "phase".

Specifically, the phase selector 6 selects one of a predetermined number of phases equally dividing one clock cycle of the output clock signal vco_ck, and generates and outputs the phase shift clock signal pi_out having the rising edge that rises at the timing of the selected phase.

The phase controller 5 controls the phase selector 6 to determine the phase of the rising edge of the phase shift clock signal pi_out to be selected by the phase selector 6 so that the cycle is changed from the output clock signal vco_ck. Specifically, the phase controller 5 determines the phase of the rising edge of the phase shift clock signal pi_out so as to make the cycle of the phase shift clock signal pi_out have a length that is changed from the cycle of the output clock signal vco_ck by a predetermined phase shift amount $\Delta ph$ (an integer multiple of the phase having been equally divided as described above).

The frequency divider 7 divides the phase shift clock signal pi_out, and inputs the divided clock into the phase frequency comparator 1 as the feedback signal fb_ck.

The fractional PLL circuit included in the SSCG circuit in the embodiment executes negative feedback control so that the frequency and the phase of the feedback signal fb_ck coincide with the frequency and the phase of the input clock signal comp_ck, respectively.

Further, the SSCG circuit 100 including the fractional PLL circuit in the embodiment generates the phase shift clock signal pi_out having the cycle that has been changed from the cycle of the output clock signal vco_ck, by the phase selector 6. This makes it possible to realize a rational division ratio, without just following an operational principle that only changes the division ratio of the frequency divider 7.

If the phase shift amount $\Delta ph$ is positive, the frequency of the feedback signal fb_ck becomes lower than the frequency of the input clock signal comp_ck; or if the phase shift amount $\Delta ph$ is negative, the frequency of the feedback signal fb_ck becomes higher than the frequency of the input clock signal comp_ck.

Further, the SSCG circuit 100 in the embodiment changes the cycle of the phase shift clock signal pi_out by the phase selector 6 so as to be capable of applying an SS modulation to the frequency of the output clock signal vco_ck.

When generating the phase shift clock signal pi_out having the cycle changed from the cycle of the output clock signal vco_ck, the phase selector 6 can further divide the output clock signal vco_ck. In the present specification, the setting value of the division ratio of the phase selector 6 is represented by div_puck=0, 1, 2, . . . , n, and it is assumed that the division ratio is n+1 if div_puck=n.

Also, if the output frequency divider 12 has the division ratio greater than or equal to 2, the phase selector 6 takes this division ratio into account, and further divides the output clock signal vco_ck.

In the present specification, the setting value of the division ratio of the output frequency divider 12 is represented by div_pll=0, 1, 2, . . . , and it is assumed that the division ratio is n+1 if div_pll=n. Also, in the present specification, the setting value of the division ratio of the frequency divider 7 is represented by div_fb=0, 1, 2, . . . , and it is assumed that the division ratio is n+1 if div_fb=n.

Therefore, the division ratio of the feedback signal fb_ck to be fed back to the phase frequency comparator 1 with respect to the output clock signal vco_ck input into the output frequency divider 12, is a product of the division ratio of the phase selector 6 and the division ratio of the frequency divider 7.

The output frequency divider 12 divides the output clock signal vco_ck having the frequency of, for example, 60 MHz to 120 MHz, to obtain the pixel clock signal pix_ck having of the frequency of, for example, 5 MHz to 40 MHz.

The phase controller 5 includes a setting value calculation part 5a (see FIG. 14), a modulation starter 5b, a shifter 5c, adders 5d and 5e, a multiplexer 5f, a count register 5g, a triangular wave controller 5h, a phase shift amount calculation part 5i, a shifter 5j, temporary number calculation parts 5k and 5l, selected phase controllers 5m and 5n, and a phase shift register 5o. Note that parts enclosed by dotted lines in the phase controller 5 are out-of-cycle feedback signal setting parts 5P and 5Q that are used when the feedback signal is out of the cycle.

Specifically, the setting value calculation part 5a of the phase controller 5 (see FIG. 14) is connected with the modulation starter 5b, the triangular wave controller 5h, and the phase shift amount calculation part 5i, and outputs a fixed value that is not changed by the clock. This will be described later in detail with reference to FIG. 14.

The modulation starter 5b is connected with the shifter 5c and the adder 5e. The modulation starter 5b outputs a count increment Δcount set by the setting value calculation part 5a to the shifter 5c and the adder 5e, at a timing coincident with the synchronization signal sync input from the outside. The count register 5g is connected with the setting value calculation part 5a outputting an SS modulation clock "puck", and the multiplexer 5f. In response to receiving input of the SS modulation clock "puck", which is a minimum time unit to execute an SS modulation set by the setting value calculation part 5a, the count register 5g outputs a count timing "count" that specifies the timing of the SS modulation clock "puck", after a predetermined amount of delay if necessary.

The adder 5e is connected with the modulation starter 5b, the count register 5g, and the multiplexer 5f. The adder 5e receives the count increment Δcount output at a predetermined cycle from the modulation starter 5b, and the count timing "count" output from the count register 5g. Then, the adder 5d outputs the count value count(n) just increased by Δcount, every count timing "count" corresponding to the SS modulation clock "puck".

The shifter 5c between the modulation starter 5b and the adder 5d shifts the count increment Δcount by one bit to double it as the value to be used for modulation.

The adder 5d is connected with the shifter 5c, the count register 5g, and the multiplexer 5f. The adder 5d receives a count increment Δcount×2 output from the modulation starter 5b and doubled by the shifter 5c, and the count value "count" output from the count register 5g. Then, the adder 5d outputs the count value count(n) just increased by Δcount×2, every count timing "count" corresponding to the SS modulation clock "puck".

The multiplexer 5f is connected with the adders 5d and 5e, the count register 5g, and the triangular wave controller 5h. The multiplexer 5f outputs a value of a count value count(n) having "int" function applied to, for example, every other timing of "count", as an integer value pixadr.

The triangular wave controller 5h is connected with the multiplexer 5f and the phase shift amount calculation part 5i. Also, the triangular wave controller 5h obtains the integer value pixadr output from the multiplexer 5f, and obtains a maximum value pi_ssd_max of fluctuation, which is a fixed value, from the setting value calculation part 5a. Then, the triangular wave controller 5h sets and outputs a second phase shift amount pi_ssd, which is a variable phase shift amount of the phase whose value changes stepwise at the timing of the integer value pixadr, within a range covering −pi_ssd_max, 0, and +pi_ssd_max, in a nearly triangular wave shape.

The phase shift amount calculation part 5i is connected with the triangular wave controller 5h and a temporary number calculation part 5l. The phase shift amount calculation part 5i obtains the variable phase shift amount pi_ssd output from the triangular wave controller 5h, and also obtains a center value pll_frac of displacement which is a fixed value from the setting value calculation part 5a. The phase shift amount calculation part 5i has an addition function, to add the fixed phase shift amount pll_frac (a first phase shift amount) being the center value to the variable phase shift amount pi_ssd (a second phase shift amount). Then, the phase shift amount calculation part 5i outputs an SS profile modulation Δph whose value changes in a nearly triangular wave shape in a range covering "pll_frac-pi_ssd_max(=pll_frac+pi_ssd_min)", pll_frac, and "pll_frac+pi_ssd_max" where the center value is the fixed phase shift amount pll_frac.

The phase shift register 5o is connected with a first temporary number calculation part 5l, a selected phase controller 5m, and the phase selector 6 disposed at the following stage of the phase controller 5. The phase shift register 5o delays the clock "puck" by a predetermined amount, and outputs a selected phase number phadd when receiving the phase control signal as input.

The first temporary number calculation part 5l is connected with the phase shift amount calculation part 5i and the phase shift register 5o. The first temporary number calculation part 5l has an addition function, obtains the SS profile modulation Δph output from the phase shift amount calculation part 5i and the selected phase number phadd output from the phase shift register 5o, and outputs a temporary selected phase number adddat.

The shifter 5j between the phase shift amount calculation part 5i and a second temporary number calculation part 5k shifts the SS profile modulation Δph by one bit to double it as a value to be used for modulation. Since the shifters 5c and 5j just execute a process for doubling a numerical value, the process can be implemented by, for example, arrangement of wiring without using an arithmetic unit such as a multiplier.

The second temporary number calculation part 5k is connected with the shifter 5j and the phase shift register 5o. The second temporary number calculation part 5k has an addition function, obtains Δph×2 as the SS profile modulation doubled by the shifter 5j, and the selected phase number phadd output from the phase shift register 5o, and outputs a temporary selected phase number adddat1.

The selected phase controller 5m is connected with the temporary number calculation parts 5l and 5k, and the phase shift register 5o. The selected phase controller 5m receives the temporary selected phase number adddat, the temporary selected phase number adddat1 as input, and outputs one of the temporary numbers adddat or adddat1 depending on an interval, as the selected phase number phadd.

The selected phase controller 5n is connected with the first temporary number calculation part 5l and the phase shift register 5o. The selected phase controller 5n is used when the selected phase number is out of the cycle of the feedback signal, namely exceeds the upper limit of the phase selection, or falls below the lower limit of the phase selection, to receive the temporary selected phase number adddat as input, and to output the temporary selected phase number adddat as a selected phase number phadd1.

The signals exchanged in the phase controller 5 will be described later in detail with reference to FIG. 12 to FIG. 19.

Figure 2:
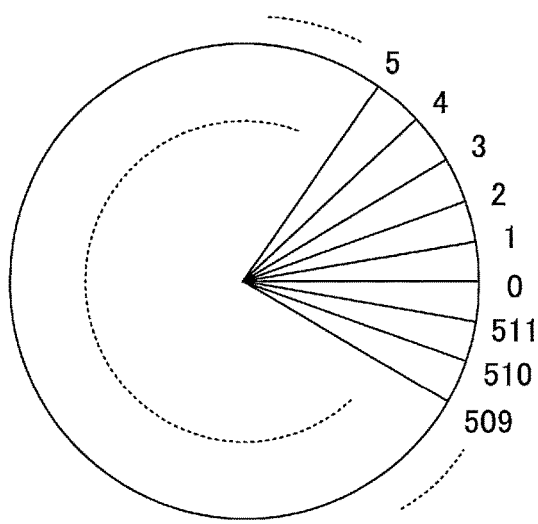
FIG. 2 is a diagram for illustrating the phase of an output clock signal vco_ck selected by a phase selector circuit illustrated in FIG. 1, to illustrate a state in which a circle is equally divided into 512 arcs.
Figure 3:
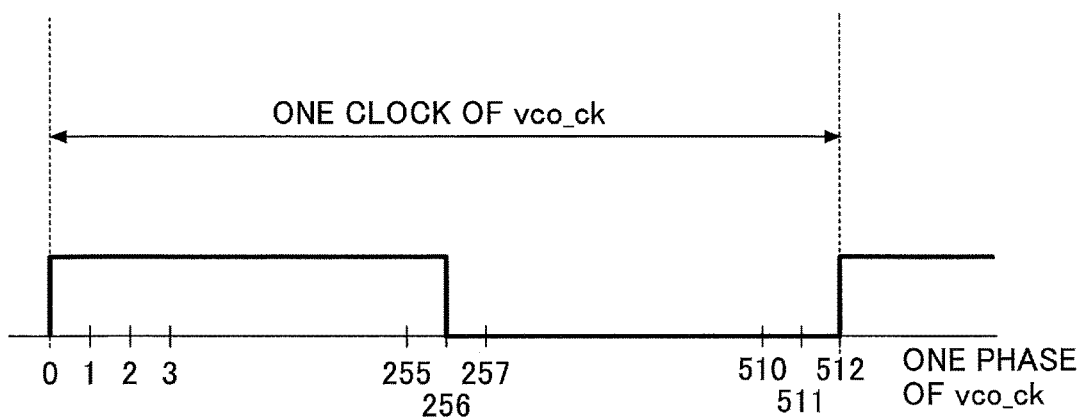
FIG. 3 is a diagram for illustrating the phase of the output clock signal vco_ck, and is a timing chart in which the circumference in FIG. 2 is extended in the horizontal direction.

FIG. 2 and FIG. 3 are diagrams for illustrating a phase of the output clock signal vco_ck selected by the phase selector 6. In the embodiment, it is assumed that the phase selector 6 selects one of 512 phases equally dividing one clock cycle of the output clock signal vco_ck. The 512 phases, or (n+1) phases, equally dividing one cycle are attached respective sequential numbers 0 to 511 (n) in FIG. 2 and FIG. 3.

FIG. 2 illustrates a state in which a circle is equally divided into 512 arcs. FIG. 3 is a timing chart in which the circumference in FIG. 2 is extended in the horizontal direction. In FIG. 3, the horizontal axis represents the phases of the output clock signal vco_ck in one clock cycle, and the vertical axis represents H/L states of the clock signal.

Also, the phase selector 6 functions as a phase interpolator that inserts a rising edge in an arbitrary phase. With reference to FIG. 4 to FIG. 11, operations of the SSCG circuit 100 as the fractional PLL circuit to insert a rising edge in an arbitrary phase will be described in detail.

<Case of Division Ratio=1 and $\Delta ph>0$>

It is assumed in examples illustrated in FIG. 4 to FIG. 7 that the division ratios of the phase selector 6, the output frequency divider 12, and the frequency divider 7 are all 1s for the sake of simplicity. In other words, it is assumed that the setting value of the division ratio of the phase selector 6 is div_puck=0; the setting value of the division ratio of the output frequency divider 12 is div_fb=0; and the setting value of the division ratio of the frequency divider 7 is divp_ll=0.

Figure 4:
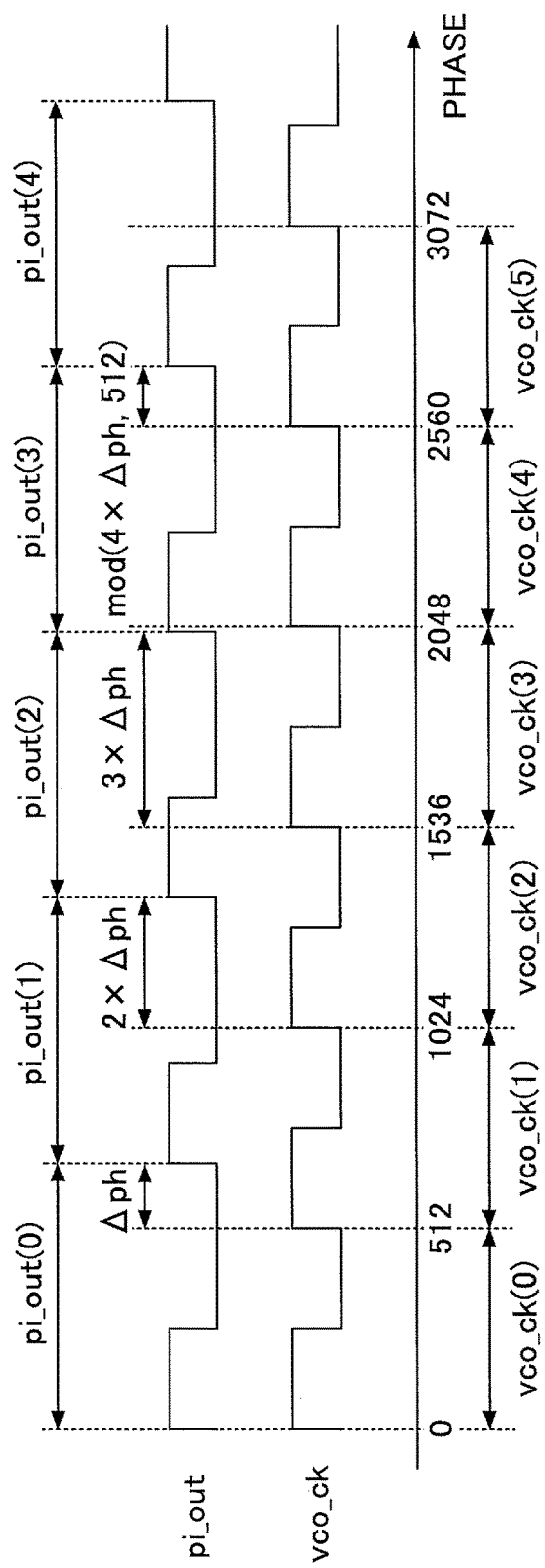
FIG. 4 is a timing chart illustrating an example of a phase shift that is executed if the division ratio is 1, and the phase shift amount Δph is positive in the phase selector circuit illustrated in FIG. 1.

FIG. 4 is an example of a phase shift executed by the phase selector 6 in FIG. 1, and is a timing chart schematically illustrating a phase shift where the phase shift amount $\Delta ph$ is positive.

The horizontal axis in FIG. 4 represents the phase of the output clock signal vco_ck. Here, the minimum unit of the horizontal axis in FIG. 4 is a phase φ that is one of the 512 phases equally dividing one clock cycle of the output clock signal vco_ck. In the following, the phase φ represents the same unit throughout FIG. 5 to FIG. 11.

The vertical axis in FIG. 4 represents H/L states of the output clock signal vco_ck and the phase shift clock signal pi_out.

In the case in FIG. 4, the cycle of the phase shift clock signal pi_out is increased from the cycle of the output clock signal vco_ck by the phase shift amount $\Delta ph$. In other words, the cycle of pi_out becomes 512+$\Delta ph$ by the unit of the phase. Therefore, every time the clock advances, the rising edge of each clock of the phase shift clock signal pi_out delays behind the rising edge of each corresponding clock of the output clock signal vco_ck, increased by the phase shift amount $\Delta ph$, clock by clock.

It is assumed, at timing of the phase 0, that the rising edge of the first clock vco_ck(0) of the output clock signal vco_ck coincides with the rising edge of the first clock pi_out(0) of the phase shift clock signal pi_out. In this case, the rising edge of the second clock pi_out(1) of the phase shift clock signal pi_out delays behind the rising edge of the second clock vco_ck(1) of the output clock signal vco_ck by the phase shift amount $\Delta ph$.

The rising edge of the third clock pi_out(2) of the phase shift clock signal pi_out delays behind the rising edge of the third clock vco_ck(2) of the output clock signal vco_ck by twice the phase shift amount $\Delta ph$.

Similarly, the rising edge of the (n)th clock pi_out(n−1) of the phase shift clock signal pi_out delays behind the rising edge of the (n)th clock vco_ck(n−1) of the output clock signal vco_ck by (n−1) times the phase shift amount $\Delta ph$.

Figure 5:
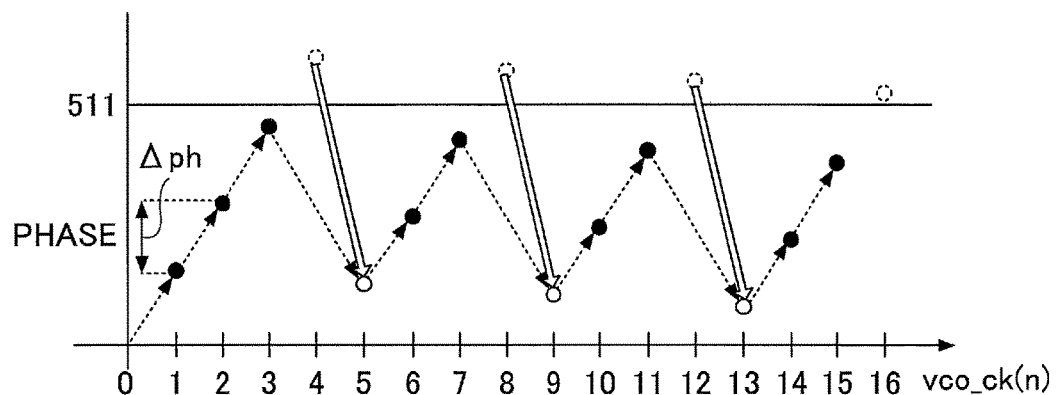
FIG. 5 is a graph illustrating a phase selected by the phase selector circuit when executing the phase shift illustrated in FIG. 4.

FIG. 5 is a graph illustrating the phase φ selected by the phase selector circuit 6 when executing the phase shift illustrated in FIG. 4. In FIG. 5, the horizontal axis represents the clock count of the output clock signal vco_ck, and the vertical axis represents the phase of the phase shift clock signal pi_out.

The phase selector 6 selects one of the phases 0 to 511, which are the 512 phases equally dividing one clock cycle of the output clock signal vco_ck, as a current phase φ.

As illustrated in FIG. 5, every time the clock of the output clock signal vco_ck advances, the phase selector 6 selects a phase φ increased by the phase shift amount $\Delta ph$ as a new phase φ, clock by clock. Note that when the phase φ is increased (delayed) by the phase shift amount $\Delta ph$, there are cases in that the incremented phase φ is within one cycle of the output clock signal vco_ck, and the incremented phase φ is over one cycle.

Specifically, if the incremented phase φ is within one cycle of the output clock signal vco_ck, the rising edge of the next clock of the phase shift clock signal pi_out is set in the corresponding phase φ in the next clock cycle of the output clock signal vco_ck.

For example, an incremented phase φ less than or equal to 511 in FIG. 5 corresponds to this case. In FIG. 5, the delay of such an incremented phase φ within one cycle of the output clock signal vco_ck is represented by a black circle and a black dotted line arrow.

On the other hand, if the incremented phase φ exceeds one cycle of the output clock signal vco_ck, the rising edge of the next clock of the phase shift clock signal pi_out is set in a phase φ subtracted 512 from the corresponding incremented phase φ, in the clock cycle after the next of the output clock signal vco_ck. For example, an incremented phase φ greater than or equal to 512 in FIG. 5 corresponds to this case.

In this way, if the incremented phase φ exceeds one cycle of the output clock signal vco_ck, for example, as illustrated in FIG. 4, the rising edge of the fifth clock pi_out(4) of the phase shift clock signal pi_out is not in the output clock signal vco_ck the fifth clock vco_ck(4), but in the cycle of the sixth clock vco_ck(5). Therefore, the phase φ delays behind the rising edge of the sixth clock vco_ck(5) of the output clock signal vco_ck by mod(4×$\Delta ph$, 512), namely, the remainder of dividing 4×$\Delta ph$ by 512.

In FIG. 5, the delay of such an incremented phase φ exceeding one cycle of the output clock signal vco_ck is designated by a white arrow. Specifically, instead of selecting a phase φ designated by a white dotted line circle for the clock vco_ck(4), vco_ck(8), or vco_ck(12) of the output clock signal vco_ck, a phase φ designated by a white solid line circle in the next clock vco_ck(5), vco_ck(9), or vco_ck(13) is selected.

By selecting the phase φ as described above with FIG. 4 and FIG. 5, the cycle of each of the clocks pi_out(0), . . . , pi_out(n) of the phase shift clock signal pi_out has the length increased by the phase shift amount $\Delta ph$ from the clock cycle of the output clock signal vco_ck. In other words, in the embodiment, the cycle of the phase shift clock signal pi_out is 512+$\Delta ph$ by the unit of the phase.

<Case of Division Ratio=1, $\Delta ph<0$>

Figure 6:
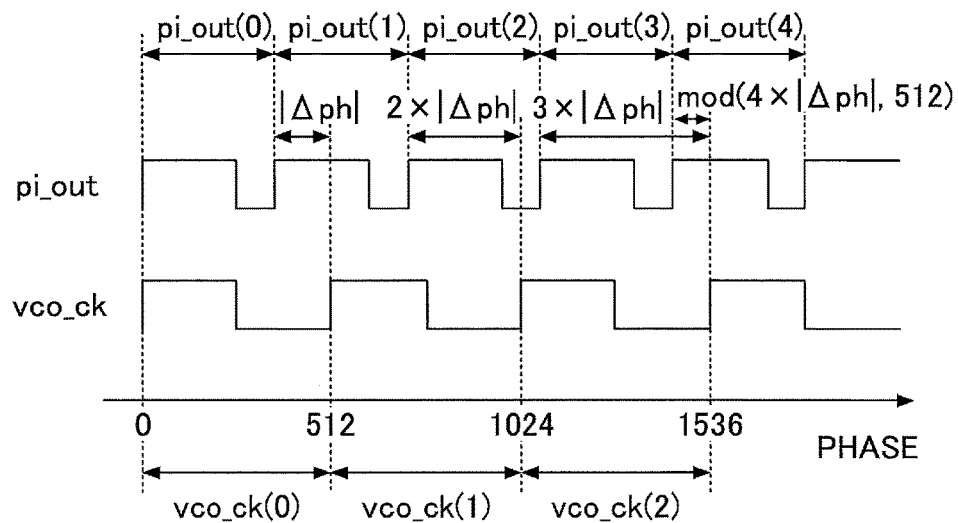
FIG. 6 is a timing chart illustrating an example of a phase shift that is executed if the division ratio is 1, and the phase shift amount Δph is negative in the phase selector circuit illustrated in FIG. 1.

Similar to the earlier case, FIG. 6 is an example of a phase shift executed by the phase selector 6 in which the division ratios of the phase selector 6, the output frequency divider 12, and the frequency divider 7 are all 1s, namely, div_puck=0, div_fb=0, and div_pll=0. In FIG. 6, the horizontal axis represents the phase of the output clock signal vco_ck, and the vertical axis represents H/L states of the output clock signal vco_ck and the phase shift clock signal pi_out.

Here, FIG. 6 is a timing chart schematically illustrating a phase shift where the phase shift amount Δph is negative.

In the case in FIG. 6, the cycle of the phase shift clock signal pi_out is decreased from the cycle of the output clock signal vco_ck by the phase shift amount |Δph| (namely, becomes 512−|Δph| by the unit of the phase). Therefore, every time the clock advances, the rising edge of each clock of the phase shift clock signal pi_out precedes the rising edge of each corresponding clock of the output clock signal vco_ck, by the phase shift amount |Δph|, clock by clock.

It is assumed, at timing of the phase 0, that the rising edge of the first clock vco_ck(0) of the output clock signal vco_ck coincides with the rising edge of the first clock pi_out(0) of the phase shift clock signal pi_out. In this case, the rising edge of the second clock pi_out(1) of the phase shift clock signal pi_out precedes the rising edge of the second clock vco_ck(1) of the output clock signal vco_ck by the phase shift amount |Δph|.

The rising edge of the third clock pi_out(2) of the phase shift clock signal pi_out precedes the rising edge of the third clock vco_ck(2) of the output clock signal vco_ck by twice the phase shift amount |Δph|.

Similarly, the rising edge of the (n)th clock pi_out(n−1) of the phase shift clock signal pi_out precedes the rising edge of the (n)th clock vco_ck(n−1) of the output clock signal vco_ck by (n−1) times the phase shift amount |Δph|.

Figure 7:
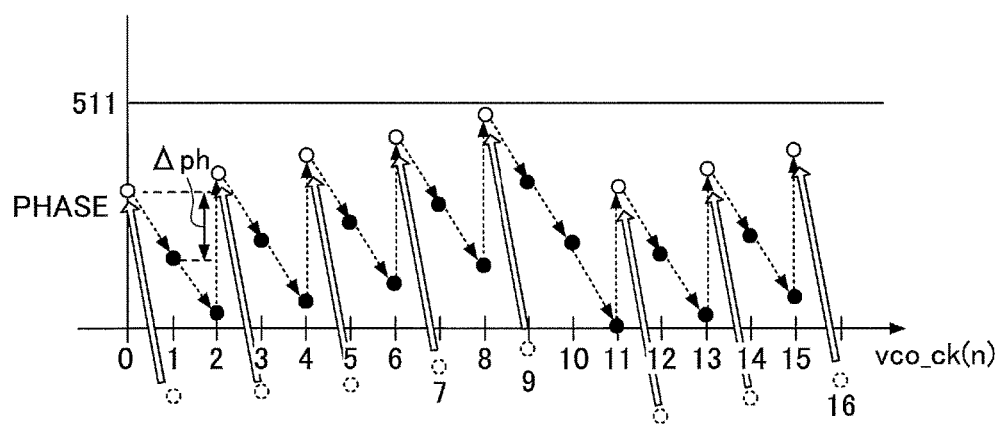
FIG. 7 is a graph illustrating a phase selected by the phase selector circuit when executing the phase shift illustrated in FIG. 6.

FIG. 7 is a graph illustrating the phase φ selected by the phase selector circuit 6 when executing the phase shift illustrated in FIG. 6. In FIG. 7, the horizontal axis represents the clock count of the output clock signal vco_ck, and the vertical axis represents the phase of the phase shift clock signal pi_out.

As illustrated in FIG. 7, every time the clock of the output clock signal vco_ck advances, the phase selector 6 selects a phase φ advanced by the phase shift amount |Δph| as a new phase φ.

Specifically, if the phase φ advanced by the phase shift amount |Δph| is not negative, the rising edge of the next clock of the phase shift clock signal pi_out is set in the corresponding phase φ in the next clock cycle of the output clock signal vco_ck.

For example, an advanced phase φ greater than or equal to 0 in FIG. 7 corresponds to this case. In FIG. 7, the advance of such an advanced phase φ within one cycle of the output clock signal vco_ck is represented by a black circle and a black dotted line arrow.

On the other hand, if the advanced phase φ is negative, the rising edge of the next clock of the phase shift clock signal pi_out does not corresponds to the rising edge of the next clock of the output clock signal vco_ck. In this case, the rising edge is set in a phase φ added 512 to the corresponding advanced phase φ in the current clock. For example, an advanced phase φ less than 0 in FIG. 7 corresponds to this case.

In this way, if the phase φ advanced by the phase shift amount |Δph| is negative, for example, as illustrated in FIG. 6, the rising edge of the fifth clock pi_out(4) of the phase shift clock signal pi_out is not in the output clock signal vco_ck the fourth clock vco_ck(3), but in the cycle of the third clock vco_ck(2). In other words, the phase φ precedes the rising edge of the fourth clock vco_ck(3) of the output clock signal vco_ck by mod(4×|Δph|, 512), namely, the remainder of dividing 4×|Δph| by 512.

In FIG. 7, the advance of such an advanced phase φ being negative is designated by a white arrow. Specifically, instead of selecting a phase φ designated by a white dotted line circle for the clock vco_ck(1), vco_ck(3), vco_ck(5), vco_ck (7), vco_ck(9), vco_ck(12), vco_ck(14), or vco_ck(16) of the output clock signal vco_ck, a phase φ designated by a white solid line circle in the previous clock the clock vco_ck(0), vco_ck(2), vco_ck(4), vco_ck(6), vco_ck(8), vco_ck(11), vco_ck(13), or vco_ck(15) is selected.

By selecting the phase φ as described above with FIG. 6 and FIG. 7, the cycle of each of the clocks pi_out(0), . . . , pi_out(n) of the phase shift clock signal pi_out has the length decreased by the phase shift amount Δph from the clock cycle of the output clock signal vco_ck. In other words, in the embodiment, the cycle of the phase shift clock signal pi_out is 512−|Δph| by the unit of the phase.

As described with reference to FIG. 4 to FIG. 7, the phase controller 5 determines the phase φ of the rising edge of the phase shift clock signal pi_out, and following the determined phase φ, controls operations of the phase selector 6.

Representing the frequency of the phase shift clock signal pi_out by fpi_out, and the frequency of the output clock signal vco_ck by fvco_ck, Formula 1 is satisfied.

$$fpi\_out = fvco\_ck \times 512/(512 + \Delta ph) \quad \text{(Formula 1)}$$

In this case, as described above, the fractional PLL circuit in the embodiment executes negative feedback control so that the frequency and the phase of the feedback signal fb_ck coincides with the frequency and the phase of the input clock signal comp_ck. Here, the input clock cycle is the reciprocal of the frequency fcomp_ck of the input clock signal comp_ck.

Therefore, Formula 2 to Formula 4 are satisfied among the frequencies of the signals where fcomp_ck represents the frequency of the input clock signal comp_ck, and ffb_ck represents the frequency of the feedback signal fb_ck.

$$ffb\_ck = fpi\_out = fcomp\_ck \quad \text{(Formula 2)}$$

$$fcomp\_ck = fvco\_ck \times 512/(512 + \Delta ph) \quad \text{(Formula 3)}$$

$$fvco\_ck = fcomp\_ck \times (1 + \Delta ph/512) \quad \text{(Formula 4)}$$

According to the SSCG circuit 100 including the fractional PLL circuit in the embodiment, by increasing the resolution of the phase selector 6, a very small multiplying factor (for example, the multiplying factor less than or equal to 1%) can be implemented. For example, in the embodiment, the minimum multiplying factor is 1/512≈≐0.002=0.2%.

<Case of Division Ratio‡1, Δph>0>

Next, with reference to FIG. 8 to FIG. 11, operations of the SSCG circuit 100 will be described taking the division ratios of the phase selector 6, the output frequency divider 12, and the frequency divider 7 into consideration, namely, one of the setting value of the division ratio of the phase selector 6 div_puck, the setting value of the division ratio of the output frequency divider 12 div_fb, and the setting value of the division ratio of the frequency divider 7 div_pll is greater than 1. Note that FIG. 8 to FIG. 11 illustrate cases where the setting value of the division ratio of the phase selector 6 is div_puck=2, namely, the division ratio of the phase selector 6 is 3.

Figure 8:
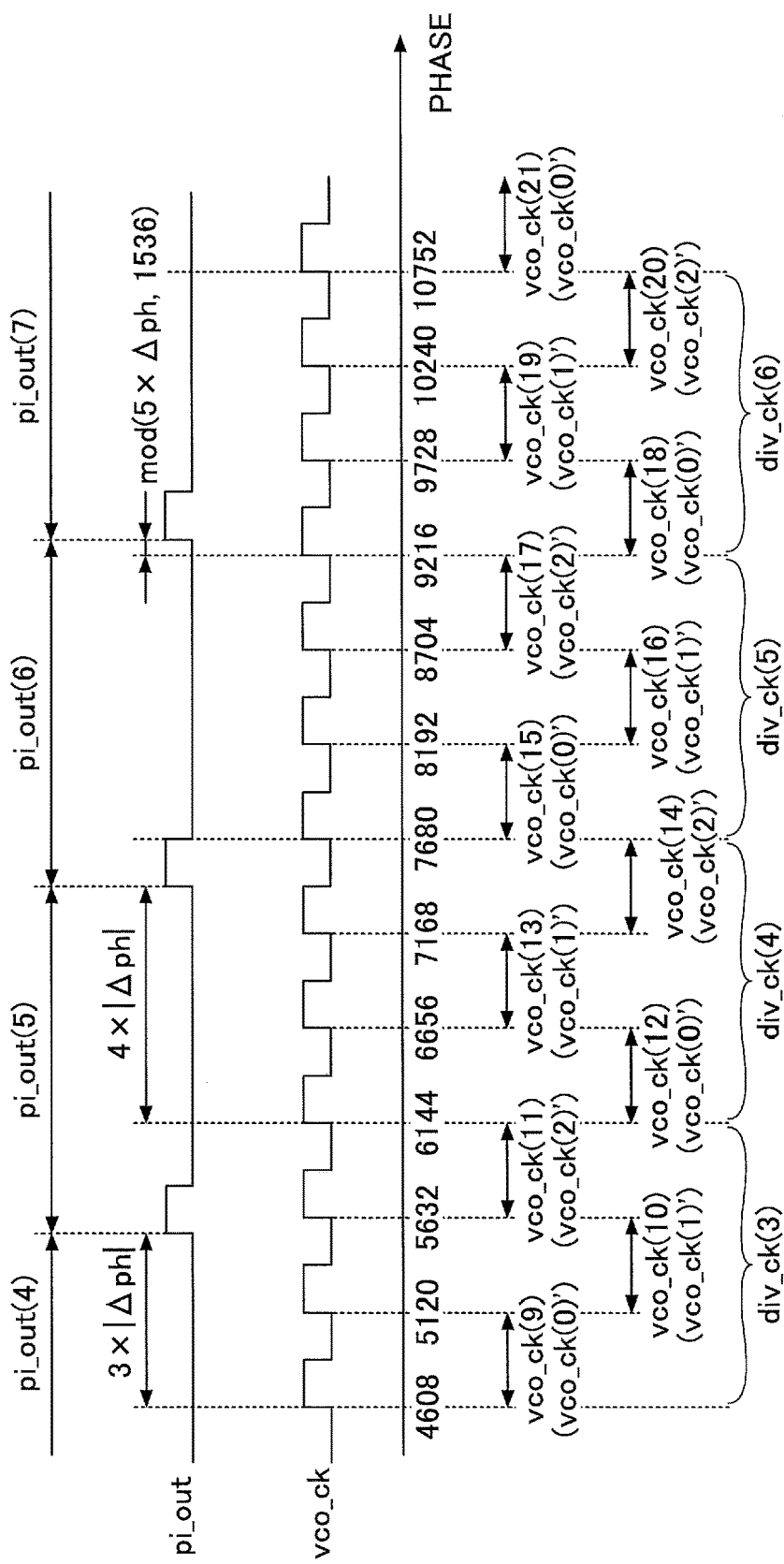
FIG. 8 is a timing chart illustrating an example of a phase shift that is executed if the division ratio is other than 1, and the phase shift amount Δph is positive in the phase selector circuit illustrated in FIG. 1.

FIG. 8 illustrates an example of a phase shift executed by the phase selector 6 of the SSCG circuit 100 in this setting state, and is a timing chart schematically illustrating a phase shift where the phase shift amount Δph is positive. In FIG. 8, the horizontal axis represents the phase of the output clock signal vco_ck, and the vertical axis represents H/L states of the output clock signal vco_ck and the phase shift clock signal pi_out.

Three clocks of the output clock signal vco_ck, which correspond to the division ratio being 3 of the phase selector 6, will be collectively referred to as a divided clock signal div_ck of the phase selector 6. For example, the tenth to twelfth clocks vco_ck(9), vco_ck(10), and vco_ck(11) of the output clock signal vco_ck correspond to the fourth clock div_ck (3) of the divided clock signal. In each clock of the divided clock signal div_ck, the three clocks of the output clock signal vco_ck will be referred to as the first to third subclocks vco_ck(0)', vco_ck(1)', and vco_ck(2)', respectively.

In the case in FIG. 8, the cycle of the phase shift clock signal pi_out is increased from the cycle of the three clocks of the output clock signal vco_ck (namely, the cycle of the divided clock signal div_ck) by the phase shift amount $\Delta$ph (namely, becomes 512×3+$\Delta$ph, by the unit of the phase). Therefore, every time the clock advances, the rising edge of each clock of the phase shift clock signal pi_out delays behind the rising edge of the output clock signal vco_ck after three clocks by the phase shift amount $\Delta$ph.

It is assumed, at timing of the phase 0, that the rising edge of the first clock vco_ck(0) of the output clock signal vco_ck coincides with the rising edge of the first clock pi_out(0) of the phase shift clock signal pi_out. The rising edge of the second clock pi_out(1) of the phase shift clock signal pi_out delays behind the rising edge of the fourth clock vco_ck(3) of the output clock signal vco_ck by the phase shift amount $\Delta$ph. The rising edge of the third clock pi_out(2) of the phase shift clock signal pi_out delays behind the rising edge of the seventh clock vco_ck(6) of the output clock signal vco_ck by twice the phase shift amount $\Delta$ph.

Similarly, the rising edge of the (n)th clock pi_out(n−1) of the phase shift clock signal pi_out delays behind the rising edge of the (3n−2)th clock vco_ck(3n−3) of the output clock signal vco_ck by (n−1) times the phase shift amount $\Delta$ph.

Figure 9:
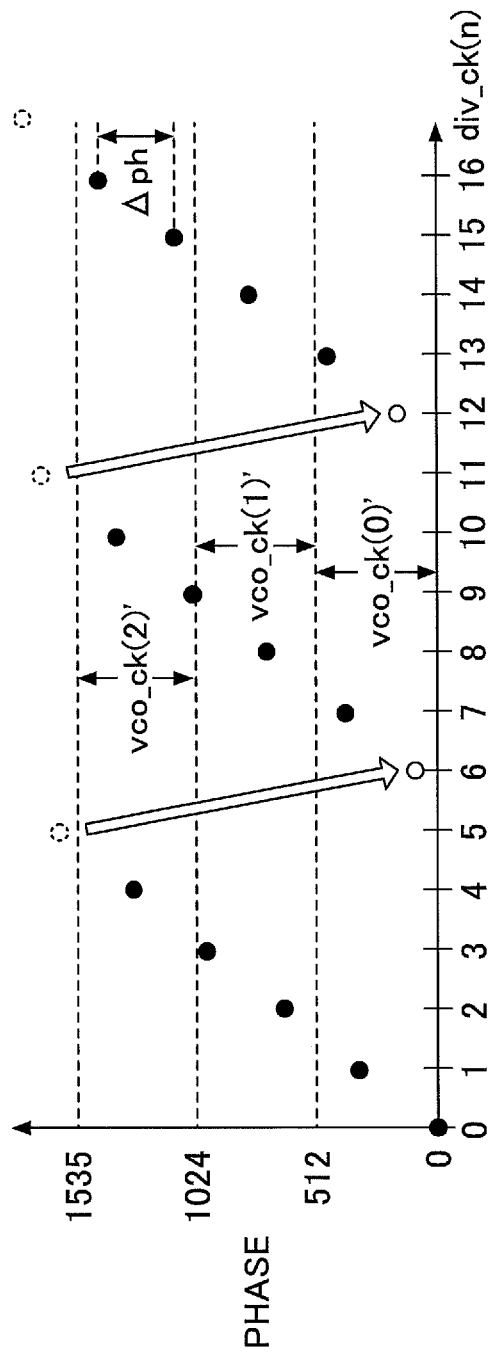
FIG. 9 is a graph illustrating a phase selected by the phase selector circuit when executing the phase shift illustrated in FIG. 8.

FIG. 9 is a graph illustrating the phase $\varphi$ selected by the phase selector circuit 6 when executing the phase shift illustrated in FIG. 8. In FIG. 9, the horizontal axis represents the clock count of the output clock signal vco_ck, and the vertical axis represents the phase of the phase shift clock signal pi_out.

The phase selector 6 selects one of the phases 0 to 1535, or the 1536 phases equally dividing one clock cycle of the divided clock signal div_ck, as a current phase $\varphi$. However, the phase selector 6 actually selects, as in FIG. 2 and FIG. 3, one of the phases 0 to 511, or the 512 phases equally dividing one clock cycle of the output clock signal vco_ck, as a current phase $\varphi$.

As illustrated in FIG. 9, every time the clock of the output clock signal div_ck advances, the phase selector 6 selects a phase $\varphi$ increased by the phase shift amount $\Delta$ph as a new phase $\varphi$. Note that when the phase $\varphi$ is increased (delayed) by the phase shift amount $\Delta$ph, there are cases in that the incremented phase $\varphi$ is within one cycle of the output clock signal div_ck, and the incremented phase $\varphi$ is over one cycle. Then, if the incremented phase $\varphi$ is within one cycle of the output clock signal div_ck, the rising edge of the next clock of the phase shift clock signal pi_out is set in the corresponding phase $\varphi$ in the next clock cycle of the divided clock signal div_ck.

For example, an incremented phase $\varphi$ less than or equal to 1535 corresponds to this case. In FIG. 9, the delay of such an incremented phase $\varphi$ less than three cycles of the output clock signal vco_ck is represented by a black circle and a black dotted line arrow.

On the other hand, if the incremented phase $\varphi$ exceeds one cycle of the divided clock signal div_ck, the rising edge of the next clock of the phase shift clock signal pi_out is set in a phase $\varphi$ subtracted 1536 from the corresponding incremented phase $\varphi$ in the clock cycle after the next of the divided clock signal div_ck. For example, an incremented phase $\varphi$ greater than 1535 corresponds to this case.

In this way, if the incremented phase $\varphi$ exceeds one cycle of the divided clock signal div_ck, for example, as illustrated in FIG. 8, the rising edge of the eighth clock pi_out(7) of the phase shift clock signal pi_out is in the seventh clock div_ck (6) of the divided clock signal. Therefore, the rising edge of the eighth clock pi_out(7) delays behind the head of the seventh clock div_ck (6) by mod(5×$\Delta$ph, 1536), namely, the remainder of dividing 5×$\Delta$ph by 1536.

In FIG. 9, the delay of such an incremented phase $\varphi$ exceeding three cycles of the output clock signal vco_ck is designated by a white arrow. In other words, instead of selecting a phase $\varphi$ designated by a white dotted line circle for the clock div_ck (5) or div_ck (11) of the divided clock signal, a phase $\varphi$ designated by a white solid line circle in the next clock div_ck (6) or div_ck (12) is selected.

By selecting the phase $\varphi$ as described above with FIG. 8 and FIG. 9, the cycle of each of the clocks pi_out(0), . . . , pi_out(n) of the phase shift clock signal pi_out has the length increased by the phase shift amount $\Delta$ph from the three clock cycles of the output clock signal vco_ck. In other words, in the embodiment, the cycle of the phase shift clock signal pi_out is 512×3+$\Delta$ph, by the unit of the phase.

<Case of Division Ratio‡1, $\Delta$ph<0>

Figure 10:
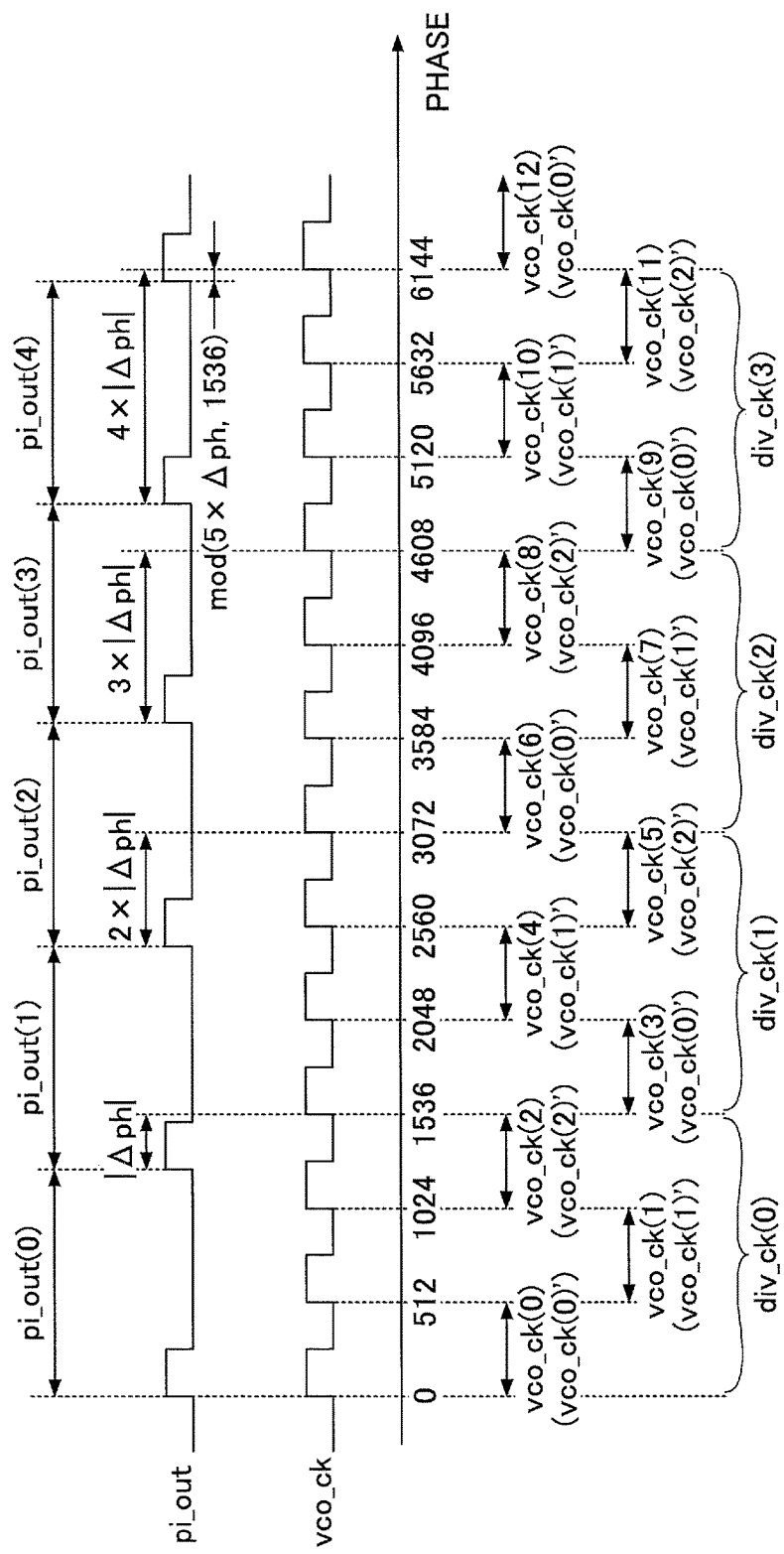
FIG. 10 is a timing chart illustrating an example of a phase shift that is executed if the division ratio is other than 1, and the phase shift amount Δph is negative in the phase selector circuit illustrated in FIG. 1.

Similar to the previous case, FIG. 10 is a timing chart schematically illustrating a phase shift where the setting value of the division ratio of the phase selector 6 is div_puck=2, namely, the division ratio of the phase selector 6 is 3. In FIG. 10, the horizontal axis represents the phase of the output clock signal vco_ck, and the vertical axis represents H/L states of the output clock signal vco_ck and the phase shift clock signal pi_out.

Specifically, FIG. 10 schematically illustrates a phase shift where the phase shift amount $\Delta$ph is negative. In the case in FIG. 10, the cycle of the phase shift clock signal pi_out shortens by the phase shift amount $\Delta$ph from three clock cycles of the output clock signal vco_ck (namely, the cycle of the divided clock signal div_ck), namely, becomes 512×3−|$\Delta$ph|, by the unit of phase.

Therefore, every time the clock advances, the rising edge of each clock of the phase shift clock signal pi_out precedes the rising edge of the output clock signal vco_ck after three clocks, by the phase shift amount |$\Delta$ph|, clock by clock.

It is assumed, at timing of the phase 0, that the rising edge of the first clock vco_ck(0) of the output clock signal vco_ck coincides with the rising edge of the first clock pi_out(0) of the phase shift clock signal pi_out. The rising edge of the second clock pi_out(1) of the phase shift clock signal pi_out precedes the rising edge of the fourth clock vco_ck(3) of the output clock signal vco_ck by the phase shift amount |$\Delta$ph|. The rising edge of the third clock pi_out(2) of the phase shift clock signal pi_out precedes the rising edge of the seventh clock vco_ck(6) of the output clock signal vco_ck by twice the phase shift amount |$\Delta$ph|.

Similarly, the rising edge of the (n)th clock pi_out(n−1) of the phase shift clock signal pi_out precedes the rising edge of the (3n−2)th clock vco_ck(3n−3) of the output clock signal vco_ck by (n−1) times the phase shift amount |$\Delta$ph|.

Figure 11:
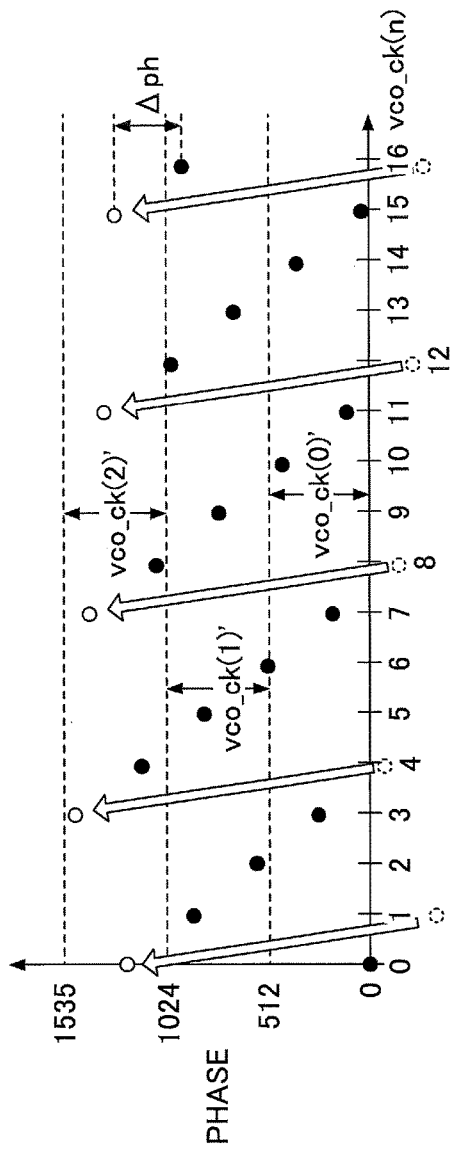
FIG. 11 is a graph illustrating a phase selected by the phase selector circuit when executing the phase shift illustrated in FIG. 10.

FIG. 11 is a graph illustrating the phase φ selected by the phase selector circuit 6 when executing the phase shift illustrated in FIG. 10. In FIG. 11, the horizontal axis represents the clock count of the output clock signal vco_ck, and the vertical axis represents the phase of the phase shift clock signal pi_out.

As illustrated in FIG. 11, every time the clock of the output clock signal div_ck advances, the phase selector 6 selects a phase φ advanced by the phase shift amount |Δph| as a new phase φ. Note that if the phase φ advanced by the phase shift amount |Δph| is not negative, the rising edge of the next clock of the phase shift clock signal pi_out is in the corresponding phase φ in the next clock cycle of the divided clock signal div_ck.

For example, an advanced phase φ greater than or equal to 0 in FIG. 11 corresponds to this case. In FIG. 11, the advance of such a decreased phase φ greater than or equal to three cycles of the output clock signal vco_ck is represented by a black circle and a black dotted line arrow.

On the other hand, if the phase φ advanced by the phase shift amount |Δph| is negative, the phase of the rising edge of the next clock of the phase of the phase shift clock signal pi_out φ is a phase adding 1536 to the advanced phase in the current cycle of the divided clock signal div_ck. For example, an advanced phase φ less than 0 in FIG. 11 corresponds to this case.

In this way, if the phase φ advanced by the phase shift amount |Δph| is negative, for example, as illustrated in FIG. 10, the rising edge of the sixth clock pi_out(5) of the phase shift clock signal pi_out is in the cycle of the fourth clock div_ck (3) of the divided clock signal.

Therefore, the phase φ precedes the rising edge of the fifth clock div_ck (4) of the divided clock signal, by mod(5× |Δph|, 1536), namely, the remainder of dividing 5×|Δph| by 1536.

In FIG. 11, the advance of such an advanced phase φ less than three cycles of the output clock signal vco_ck is designated by a white arrow. In other words, instead of selecting a phase φ designated by a white dotted line circle for the clock div_ck (1), div_ck (4), div_ck (8), div_ck (12), or div_ck (16) of the divided clock signal, a phase φ designated by a white solid line circle in the previous clock div_ck (0), div_ck (3), div_ck (7), div_ck (11), or div_ck (15) is selected.

By selecting the phase φ as described above with FIG. 10 and FIG. 11, the cycle of each of the clocks pi_out(0), . . . , pi_out(n) of the phase shift clock signal pi_out has the length decreased by the phase shift amount |Δph| from the three clock cycles of the output clock signal vco_ck. In other words, in the embodiment, the cycle of the phase shift clock signal pi_out is 512×3−|Δph|, by the unit of the phase.

As described with reference to FIG. 8 to FIG. 11, the phase controller 5 determines the phase of the rising edge of the phase shift clock signal pi_out φ, and following the determined phase φ, controls operations of the phase selector 6.

As in FIG. 8 to FIG. 11, if one of the setting value of the division ratio of the phase selector 6 div_puck, the setting value of the division ratio of the output frequency divider 12 div_fb, and the setting value of the division ratio of the frequency divider 7 div_pll is greater than 1, Formulas 1, 3, and 4 are transformed into Formulas 5, 6, and 7, respectively.

$$fpi\_out = fvco\_ck \times 512 / \{512 \times (div\_pll + 1) \times (div\_puck + 1) + \Delta ph\} \quad \text{(Formula 5)}$$

$$\begin{aligned} fcomp\_ck &= ffb\_ck \\ &= fpi\_out / ([div\_fb] + 1) \\ &= fvco\_ck \times 512 / [\{512 \times (div\_pll + 1) \times (div\_puck + 1) + \Delta ph\} \times ([div\_fb] + 1)] \end{aligned} \quad \text{(Formula 6)}$$

$$\begin{aligned} fvco\_ck &= fcomp\_ck \times (div\_fb + 1) \times \\ & \quad \{512 \times (div\_pll + 1) \times \\ & \quad (div\_puck + 1) + \Delta ph\} / 512 \\ &= fcomp\_ck \times (div\_fb + 1) \times \{(div\_pll + 1) \times \\ & \quad (div\_puck + 1) + \Delta ph / 512\} \\ &= fcomp\_ck \times \{(div\_fb + 1) \times (div\_pll + 1) \times \\ & \quad (div\_puck + 1) + (div\_fb + 1) \times \Delta ph / 512\} \end{aligned} \quad \text{(Formula 7)}$$

According to the SSCG circuit 100 including the fractional PLL circuit in the embodiment, the phase selector 6 executing division can realize an even smaller multiplying factor. For example, in a model by Formula 5 to Formula 7 representing cases in FIG. 8 to FIG. 11, the minimum multiplying factor (%) can be controlled to be very small as represented by Formula 8.

$$\begin{aligned} ([div\_fb] + 1) \times \Delta ph / 512 &\approx 0.002 \times ([div\_fb] + 1) \\ &= 0.2 \times ([div\_fb] + 1)\% \end{aligned} \quad \text{(Formula 8)}$$

The minimum unit of the change rate of the frequency fvco_ck of the output clock signal vco_ck is represented by Formula 9.

$$\begin{aligned} \Delta fvco\_ck / fvco\_ck &= \{(div\_pll + 1) \times (div\_puck + 1) + \\ & \quad \Delta ph / 512\} / \{(div\_pll + 1) \times \\ & \quad (div\_puck + 1) + 0 / 512\} \\ &= 1 + \Delta ph / \{512 \times (div\_pll + 1) \times \\ & \quad (div\_puck + 1)\} \\ &\approx 1 + 0.002 / \{(div\_pll + 1) \times \\ & \quad (div\_puck + 1)\} \end{aligned} \quad \text{(Formula 9)}$$

In this way, according to the SSCG circuit 100 including the fractional PLL circuit in the embodiment, the division ratio of the frequency divider 7 is a fixed value during the operation, and the phase shift clock signal pi_out and the frequency of the feedback signal fb_ck are also fixed.

Therefore, noncoincidence between the phases in the phase frequency comparator 1, which may be generated when the division ratio of frequency divider is changed as in the conventional art, can be resolved. Then, it is possible to prevent generation of spurious, which is an unnecessary signal component mixing into the output clock signal vco_ck due to such noncoincidence of the phases, and to reduce the jitter, which is fluctuation of the phase of the output clock signal vco_ck.

Also, according to the SSCG circuit 100 including the fractional PLL circuit in the embodiment, by increasing the resolution of the phase selector 6, the division ratio of the frequency divider 7 can be made smaller.

Consequently, the loop band of the fractional PLL circuit can be increased, and the jitter being the fluctuation of the phase of the output clock signal vco_ck can be reduced.

In this way, according to the embodiment, it is possible to provide an SSCG circuit including a fractional PLL circuit that does not require an operational principle that the division ratio of the frequency divider is changed. Also, the phase selector 6 executing division can improve the resolution of the fractional PLL circuit.

<About Spread Spectrum Modulation>

Figure 12:
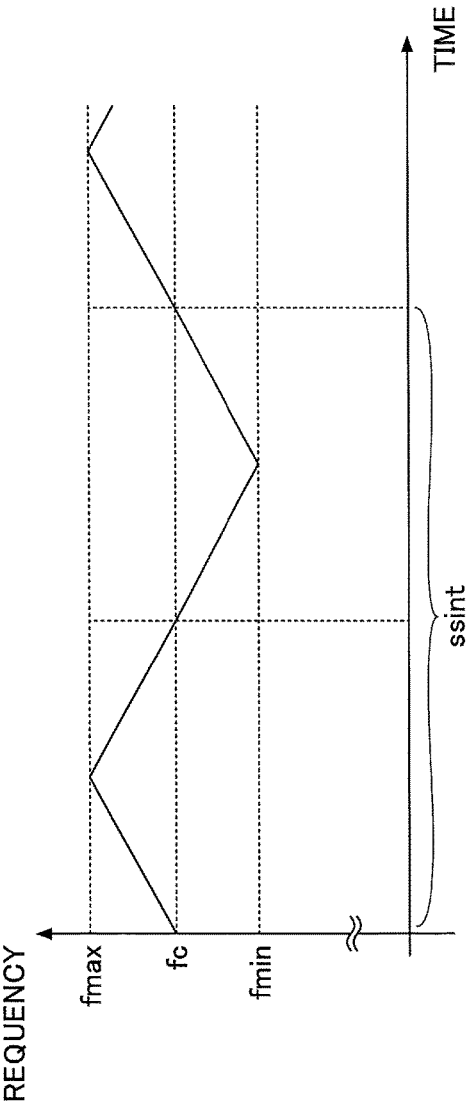
FIG. 12 is a diagram for illustrating spread spectrum (SS) modulation.

FIG. 12 is a diagram for illustrating spread spectrum (SS) modulation. In FIG. 12, the horizontal axis represents time, and the vertical axis represents the frequency.

Having an SS modulation applied to, the frequency of the output clock signal vco_ck changes periodically by a modulation cycle ss_int, between a maximum value fmax and a minimum value fmin, around a predetermined frequency fc as the center.

Specifically, in the embodiment, the triangular wave controller 5h executes the following calculation. By changing the phase shift amount (the shift amount) Δph described above in the spread spectrum clock generation (SSGC) circuit 100, the frequency of the output clock signal vco_ck can be changed as in FIG. 12.

When the phase shift amount Δph increases, the frequency fvco_ck of the output clock signal vco_ck increases, and when the phase shift amount Δph decreases, the frequency fvco_ck of the output clock signal vco_ck decreases.

Specifically, by applying an SS modulation, the frequency of the output clock signal vco_ck changes periodically by the modulation cycle ss_int, between the maximum value fmax and the minimum value fmin of the frequency with the predetermined frequency fc as the center.

The triangular wave controller 5h (see FIG. 1) has the degree of modulation ss_amp set that represents the maximum change rate of the frequency of the output clock signal vco_ck. The degree of modulation ss_amp takes an integer value between 0 and 31, and the maximum change rate of the frequency of the output clock signal vco_ck is represented by ss_amp/1024(%). For example, if ss_amp=31, the frequency of the output clock signal vco_ck increases by about 3.1% with respect to the center frequency fc in terms of the maximum frequency fmax, and decreases by about 3.1% with respect to the center frequency fc in terms of the minimum frequency fmin.

The triangular wave controller 5h generates an SS modulation profile Δph, which is waveform data (the phase shift amount) for SS modulation for changing the frequency of the output clock signal vco_ck within the range of the maximum change rate. The SS modulation profile Δph takes an integer value, for example, between 0 and 255, and the maximum value 255 corresponds to the maximum frequency fmax, the minimum value 0 corresponds to the minimum frequency fmin, and a value 128 corresponds to the center frequency fc representing the frequency not changed.

In the following, an example of calculating an SS modulation profile Δph will be described in a case where the frequency of the output clock signal vco_ck changes in a triangular wave shape as illustrated in FIG. 12. To calculate the SS modulation profile Δph, for example, a count value count(n) is used that increments every clock of the pixel clock signal pix_ck.

The step size Δcount of the count value count(n), the initial value of the count value count(0), and the count value count(n) are represented by Formula 10 to Formula 12, respectively.

$$\Delta count = 2 \times 255 / ss\_int \quad \text{(Formula 10)}$$

$$count(0) = 0 \quad \text{(Formula 11)}$$

$$count(n) = count(n-1) + \Delta count, 1 \leq n \leq ss\_int - 1 \quad \text{(Formula 12)}$$

The count value count(n) increments by the step size Δcount over the modulation cycle ss_int. Depending on the count value count(n), an SS modulation profile Δph is calculated by the following Formula 13 to Formula 15.

Figure 13:
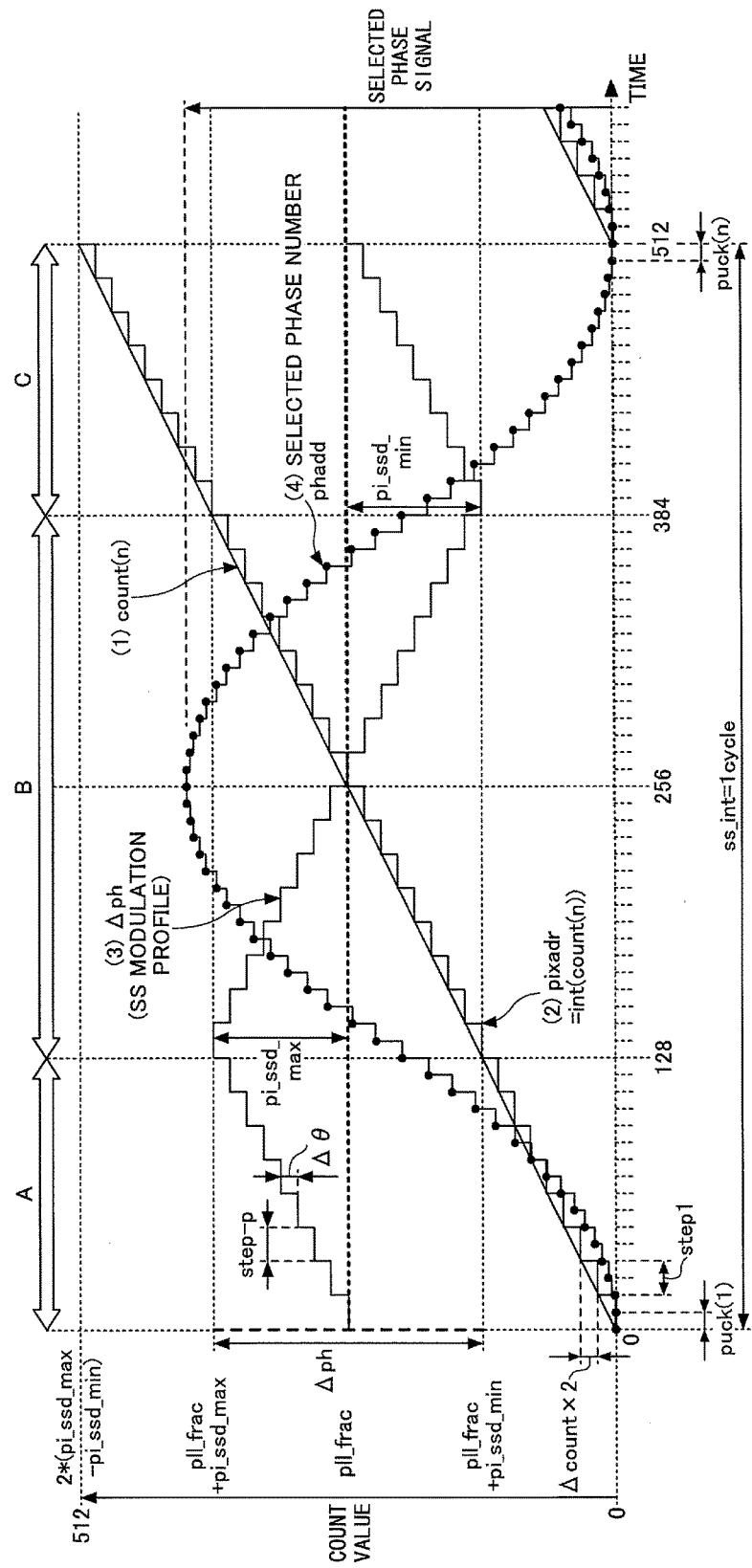
FIG. 13 is a diagram for illustrating phase selection in a cycle of a feedback signal fb_ck by a phase controller and the phase selector circuit in FIG. 1, and spread spectrum modulation.

Here, in FIG. 13, 0≤int(count(n))<128 corresponds to a range A, 128int(count(n))≤383 corresponds to a range B, and 383<int(count(n))<510 corresponds to the range C.

Case of 0≤int(count(n))<128:

$$\Delta ph = 128 + int(count(n)) \quad \text{(Formula 13)}$$

Case of 128≤int(count(n))≤383:

$$\Delta ph = 255 - \{int(count(n)) - 127\} \quad \text{(Formula 14)}$$
$$= 382 - int(count(n))$$

Case of 383<int(count(n))<510:

$$\Delta ph = 128 + \{int(count(n)) - (2 \times 255 - 0)\} \quad \text{(Formula 15)}$$
$$= int(count(n)) - 382$$

where int(count(n)) represents the integer part (pixadr) of the count value count(n). The frequency f of the output clock signal vco_ck changes in a triangular wave shape depending on the setting value div_puck of the division ratio of the phase selector 6, the setting value div_fb of the division ratio of the output frequency divider 12, the setting value div_pll of the division ratio of the frequency divider 7, the degree of modulation ss_amp, and the modulation cycle ss_int.

<Phase Selection>

In the embodiment in the present disclosure, the SS modulation profile is changed by the phase controller 5 for cases of the phase selected: a case exceeding the upper limit of the phase selection; case falling below the lower limit of the phase selection; and a case within the upper and lower limits of the phase selection. In the SS modulation profile, a step time interval for changing the phase shift amount Δph, and an amount of change that represents a position in the predetermined cycle are specified. These will be described by using FIG. 13 to FIG. 16.

FIG. 13 is a diagram for illustrating the phase selection and the spread spectrum modulation in the cycle of the feedback signal fb_ck by the phase controller 5 and the phase selector circuit 6 in FIG. 1.

FIG. 13 illustrates changes of four types of parameters, and the horizontal axis is common to represent time. The four types of parameters illustrated in FIG. 13 are (1) the count value count(n); (2) the integer part pixadr of the count value count(n); (3) the phase shift amount (the shift amount or the modulation profile) Δph; and (4) the selected phase number phadd.

On the horizontal axis in FIG. 13, ss_int represents the modulation cycle. Also, puck(1), . . . , puck(n) partition the modulation cycle ss_int, and represent respective count cycles of the modulation clock puck(n).

The count value count(n) being the first parameter increases by the step size Δcount every modulation clock puck(n). The count value count(n) is output from the modulation starter 5b. Note that since the amount of displacement at each step of the count value is smaller than the other parameters, it is illustrated in a line in FIG. 13, but if enlarged, the count value changes stepwise at every clock.

The integer value pixadr being the second parameter is an integer value obtained by applying the int function to the count value to round off the fractions of the count value count(n) (pixadr=int(count(n)). Every step time interval step_p, which corresponds to two intervals of the modulation clock puck(n), the integer value pixadr rises one step.

In FIG. 13, the vertical axis is common for (1) the count value count(n), and (2) the integer value pixadr, to represents count values (0 to 512). Note that in FIG. 13, the number for the count value, and the number for the step time interval step_p are omitted in illustration.

The SS modulation profile Δph being the third parameter changes stepwise by the step size Δθ every step time interval step_p. The SS modulation profile Δph is a value that is changed depending on a variable phase shift amount pi_ssd with respect to the center phase shift value being a fixed value set as pll_frac. The SS modulation profile Δph is output from the phase shift amount calculation part 5i having an addition function.

Also, the SS modulation profile Δph changes within a range between the minimum value (pi_ssd_min=−pi_ssd_max) of the variable phase shift amount pi_ssd and the maximum value pi_ssd_max, namely, the range of 2×pi_ssd_max. In other words, having the center value of the phase shift amount Δph set as pll_frac, the phase shift amount Δph changes stepwise in a nearly triangular wave shape, which the range between "pll_frac−pi_ssd_max" and "pll_frac+pi_ssd_max" (a predetermined range).

In FIG. 13, the vertical axis corresponding to (3) the phase shift amount Δph represents the phase shift amount of the rising edge of the phase shift clock signal pi_out from the output clock signal vco_ck, which corresponds to a phase shift.

The selected phase number phadd being the fourth parameter changes every modulation clock puck(n), depending on the degree of modulation set by calculation. Note that as the entire change of a collection of changes, the selected phase number phadd changes stepwise in a nearly triangular wave shape, shifted from the SS modulation profile tph by a half cycle.

In FIG. 13, the vertical axis corresponding to (4) the selected phase number represents the phase number.

Figure 14:
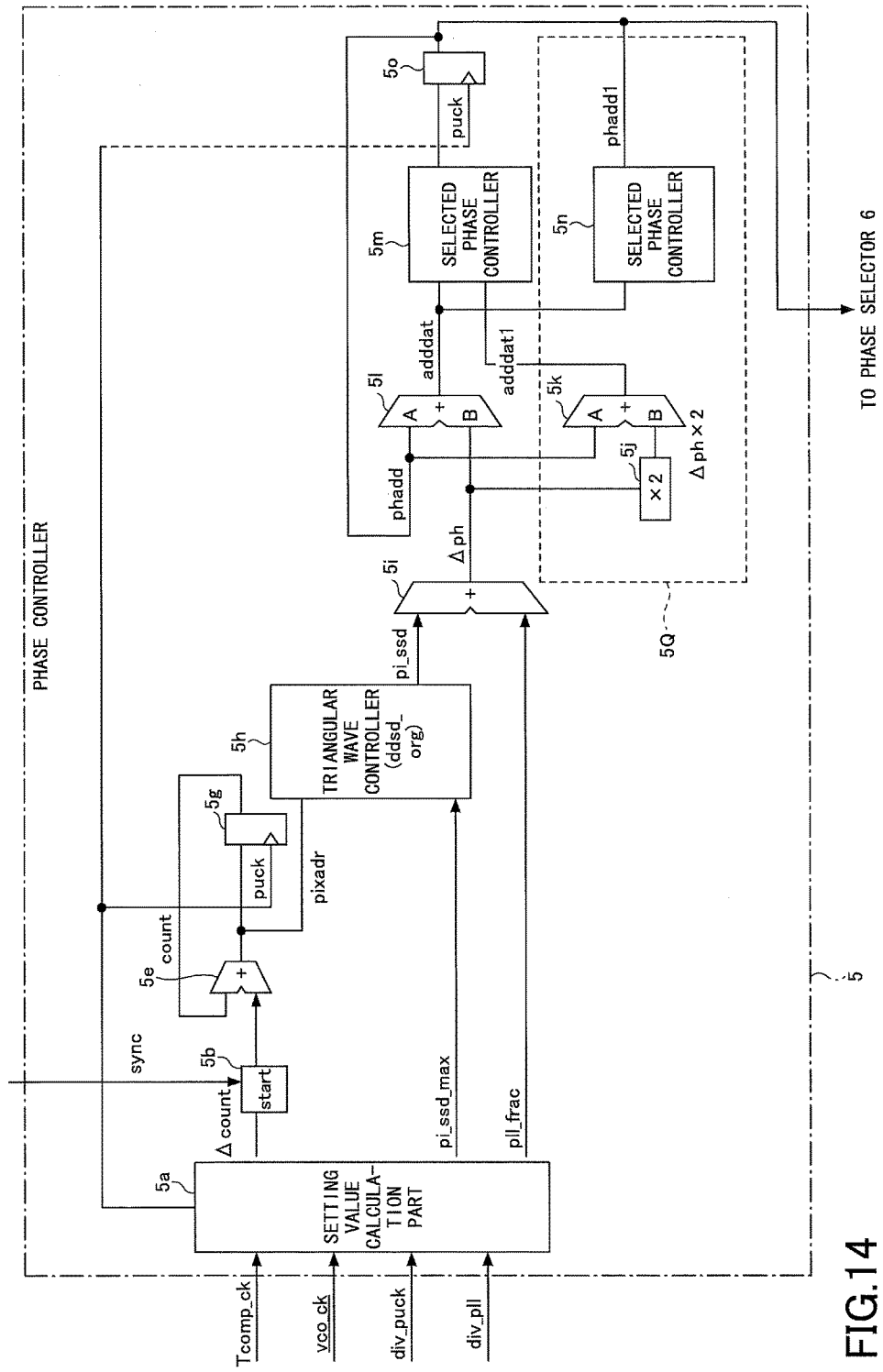
FIG. 14 is a diagram for illustrating a configuration of the phase controller in FIG. 1 and an SS modulation profile.

FIG. 14 is a diagram for illustrating the configuration of the phase controller 5 in FIG. 1 and the SS modulation profile. Note that the out-of-cycle feedback signal setting parts 5P and 5Q are not used for a phase selection in the cycle of the feedback signal fb_ck, and their illustration is omitted in FIG. 14.

As has been described with reference to FIG. 4 to FIG. 11, the SSCG circuit including the fractional PLL circuit in the embodiment changes the cycle of the phase shift clock signal pi_out from the cycle of the output clock signal vco_ck by the phase shift amount (the shift amount) Δph.

In this case, the SSCG circuit uses the phase shift amount Δph, which is a value changed from the fixed phase shift amount pll_frac being the center of the phase shift by the variable phase shift amount pi_ssd, to execute the SS modulation of the output clock signal vco_ck.

The frequency of the output clock signal vco_ck changes in a triangular wave shape as in FIG. 12, depending on the setting value div_puck of the division ratio of the phase selector 6, the setting value div_fb of the division ratio of the output frequency divider 12, the setting value div_pll of the division ratio of the frequency divider 7, the degree of modulation ss_amp, and the modulation cycle ss_int.

First, the setting value calculation part 5a sets minimum time units to change the phase shift amount (the shift amount) Δph for executing the SS modulation, as SS modulation clocks puck(0), puck(1), . . . , puck(n). The SS modulation clock puck(n) is obtained by dividing the clock of the output clock signal vco_ck by the division ratio of the output frequency divider 12 and the division ratio of the phase selector 6. Therefore, the frequency fpuck of the SS modulation clock puck(n) is represented by the following Formulas 16-17.

$$fpuck = fpix\_ck/(div\_puck+1) \quad \text{(Formula 16)}$$

$$fpix\_ck = fvco\_ck/(div\_pll+1) \quad \text{(Formula 17)}$$

As illustrated in FIG. 13, the phase shift amount Δph is changed stepwise by the step size Δθ every time interval step_p including a predetermined number of clocks puck(n), the phase shift amount Δph is changed in a triangular wave shape approximately. The time interval step_p including a predetermined number of clocks puck(n) will be referred to as the "step time interval step_p". The predetermined number of clocks of the SS modulation clock puck(n) in the step time interval step_p varies depending on the setting.

Next, the setting value calculation part 5a calculates the maximum value pi_ssd_max and the minimum value pi_ssd_min of the variable phase shift amount pi_ssd by the following Formulas 18-20.

$$pi\_ssd\_max = int([ss\_amp]/1024/\Delta f\_step) \quad \text{(Formula 18)}$$

$$pi\_ssd\_min = -int([ss\_amp]/1024/\Delta f\_step) \quad \text{(Formula 19)}$$

$$\Delta f\_step = \Delta fvco\_ck/fvco\_ck - 1 \quad \text{(Formula 20)}$$
$$= 1/512/\{(div\_pll+1) \times (div\_puck+1)\}$$

As has been described with FIG. 12, the degree of modulation ss_amp is set in the triangular wave controller 5h, to represent the maximum change rate of the frequency of the output clock signal vco_ck.

To calculate the variable phase shift amount pi_ssd, the count value count(n) is introduced that increments every modulation clock puck(n).

In this case, the modulation starter 5b starts a modulation, namely, starts incrementing the count to be incremented every modulation clock puck(n), synchronized with timing of the synchronization signal sync that is input from the outside, which will be described later with FIG. 17 and FIG. 18.

The count value count(n) and the step size Δcount are represented by fractions that include, for example, a 9-bit integer part and a 16-bit fraction part. The step size Δcount of the count value, the initial value count(0) of the count value, and the count value count(n) are represented by the following Formulas 21-23.

$$\Delta count = 2 \times (pi\_ssd\_max - pi\_ssd\_min)/(Tss/Tcomp\_ck) \quad \text{(Formula 21)}$$

where Tss represents the SS modulation cycle, and Tcomp_ck represents the cycle of the input clock comp_ck. In other words, the maximum value 512 on the vertical axis representing the clock count(n) illustrated in FIG. 13 corresponds to an amount of change "2×(pi_ssd_max−pi_ssd_min)".

$$count(0) = 0 \quad \text{(Formula 22)}$$

$$count(n) = count(n-1) + \Delta count \quad \text{(Formula 23)}$$

where $1 \leq n \leq ss\_int - 1$.

This calculation is calculated by the adder 5e and the multiplexer 5f.

The triangular wave controller 5h executes the following calculation by using the step size Δcount, the maximum value pi_ssd_max, and the minimum value pi_ssd_min of the variable phase shift amount pi_ssd described above.

The modulation cycle ss_int represents the SS modulation cycle by the units of puck, and is calculated by the following Formula 24.

$$ss\_int = \text{roundup}(2 \times (pi\_ssd\_max - pi\_ssd\_min)/\Delta count) \quad \text{(Formula 24)}$$

where "roundup( )" is a rounding-off operator.

The count value count(n) increments by the step size Δcount over the modulation cycle ss_int. Depending on the count value count(n), the variable phase shift amount (second phase shift amount) pi_ssd is calculated by the following formulas. Here, Formula 25 corresponds to the range A in FIG. 13, Formula 26 corresponds to the range B in FIG. 13, and Formula 27 corresponds to the range C in FIG. 13.

((Range of A))
Case of 0≤int(count(n))<pi_ssd_max+1:

$$pi\_ssd = \text{int}(count(n)) \quad \text{(Formula 25)}$$

((Range of B))
Case of pi_ssd_max+1≤int(count(n))<pi_ssd_max+1+(pi_ssd_max−pi_ssd_min):

$$pi\_ssd = pi\_ssd\_max - \{\text{int}(count(n)) - pi\_ssd\_max\} \quad \text{(Formula 26)}$$

((Range of C))
Case of pi_ssd_max+1+(pi_ssd_max−pi_ssd_min)≤int(count(n))<2×(pi_ssd_max−pi_ssd_min):

$$pi\_ssd = pi\_ssd\_min + \{\text{int}(count(n)) - (2 \times pi\_ssd\_max - pi\_ssd\_min)\} \quad \text{(Formula 27)}$$

Following Formula 18 to Formula 25, the modulation is started synchronized with timing of the synchronization signal sync, and since n is a positive number, as illustrated in FIG. 13 by (3) modulation profile Δph, the waveform of the phase shift certainly starts appearing on the positive side.

Therefore, in the clock cycle of the feedback signal, selection control is executed so that the SS modulation certainly starts phase shifting on the positive side.

As described above, the phase shift amount Δph is changed from the center phase shift amount pll_frac being the center value of the change, by the calculated variable phase shift amount pi_ssd. In other words, the phase shift amount calculation part 5i having an addition function adds the fixed phase shift amount pll_frac being the center, to the variable phase shift amount pi_ssd that is changing, to calculate the phase shift amount Δph. Then, based on the phase shift amount Δph, the SS modulation of the output clock signal vco_ck is executed.

A phase is selected for the phase shift to execute the SS modulation. The number to identify the selected phase will be referred to as the "selected phase number". The selected phase number is selected and output by the temporary number calculation part 5l, and the selected phase controllers 5m and 5n.

Here, the temporary selected phase number adddat is calculated by the following Formula 28.

$$adddat(n) = phadd(n) + pi\_ssd(n) \quad \text{(Formula 28)}$$

The selected phase number phadd is calculated by the following Formula 29.

$$phadd(n) = adddat(n-1) \quad \text{(Formula 29)}$$

As described above, it is possible to execute phase control by classifying phases in the cycle of the feedback signal fb_ck.

Note that the step time interval step_p is calculated by the following Formula 30.

$$step\_p(k) = \text{roundup}((k+1)/\Delta count) - \text{roundup}(k/\Delta count) \quad \text{(Formula 30)}$$

where k=int(count(n)).

The sums ph_A, ph_B, and ph_C of the variable phase shift amount pi_ssd in states in the modulation cycle ss_int are calculated by the following Formulas 31-33. Note that the sum ph_A is taken over the range A in FIG. 13, the sum ph_B over the range B, and the sum ph_C over the range C.

((Range of A))
Case of 0≤int(count(n))<pi_ssd_max+1:

$$ph\_A = \sum_{k=0}^{pi\_ssd\_max} k \times step\_p(k) \quad \text{(Formula 31)}$$

((Range of B))
Case of pi_ssd_max+1≤int(count(n))<pi_ssd_max+1+(pi_ssd_max−pi_ssd_min):

$$ph\_B = \sum_{k=pi\_ssd\_max+1}^{3 \times pi\_ssd\_max} (2 \times pi\_ssd\_max - k) \times step\_p(k) \quad \text{(Formula 32)}$$

((Range of C))
Case of pi_ssd_max+1+(pi_ssd_max−pi_ssd_min)≤int(count(n))<2×(pi_ssd_max−pi_ssd_min):

$$ph\_C = \sum_{k=3 \times pi\_ssd\_max+1}^{4 \times pi\_ssd\_max - 1} (k - 4 \times pi\_ssd\_max) \times step\_p(k) \quad \text{(Formula 33)}$$

The sum ph_T of the variable phase shift amount pi_ssd over the states in the modulation cycle ss_int is represented by the following formula.

When the sum ph_T of the variable phase shift amount pi_ssd is 0, specifically, when a cycle represented by (4) the selected phase number phadd in FIG. 13 is about to start (0) and to end, the selected phase number at the start is the same as the selected phase number at the start (=0). Therefore, the same number is selected as the selected phase number every cycle on the time axis. In other words, the phase in the cycle of the feedback signal fb_ck is selected.

$$ph\_T = ph\_A + ph\_B + ph\_C$$

$$ph\_T = 0 \quad \text{(Formula 34)}$$

By Formula 18 to Formula 34, the same SS modulation profile is obtained every cycle of the modulation cycle ss_int, which has an effect that an SS modulation cycle error is not generated.

As described above, if the phase is in the cycle of the feedback signal fb_ck, the phase shift controller controls the phase by the cycle of the reference clock input into the phase frequency comparator, the division ratio of the feedback clock, the SS modulation cycle, and the degree of modulation.

Therefore, it has an effect that the user can intentionally execute the phase control.

<Selection of Phase Out of Cycle>

Further, for a case where the degree of modulation is set by which a phase out of the cycle of the feedback signal fb_ck is to be selected, a function is provided to change the degree of modulation so as to make the sum ph_T of the variable phase shift amount pi_ssd, which corresponds to the amount of change of the phase shifts, become 0, and to control selecting a phase in the cycle of the feedback signal fb_ck as in FIG. 13. Selection of a phase out of the cycle of the feedback signal will be described below.

Figure 15:
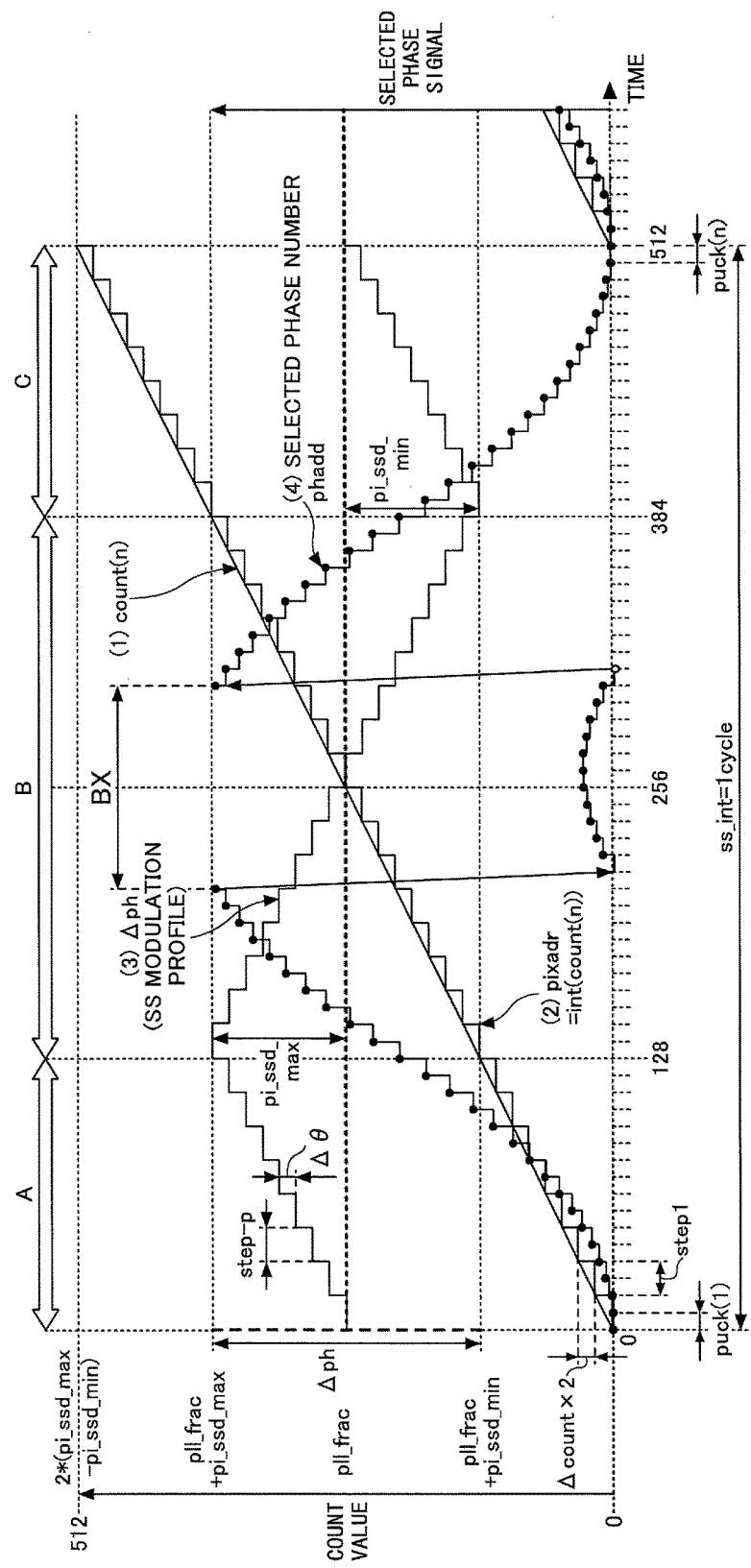
FIG. 15 is a diagram for illustrating phase selection out of the cycle of the feedback signal fb_ck by the phase controller and the phase selector circuit in FIG. 1 and spread spectrum modulation.
Figure 16:
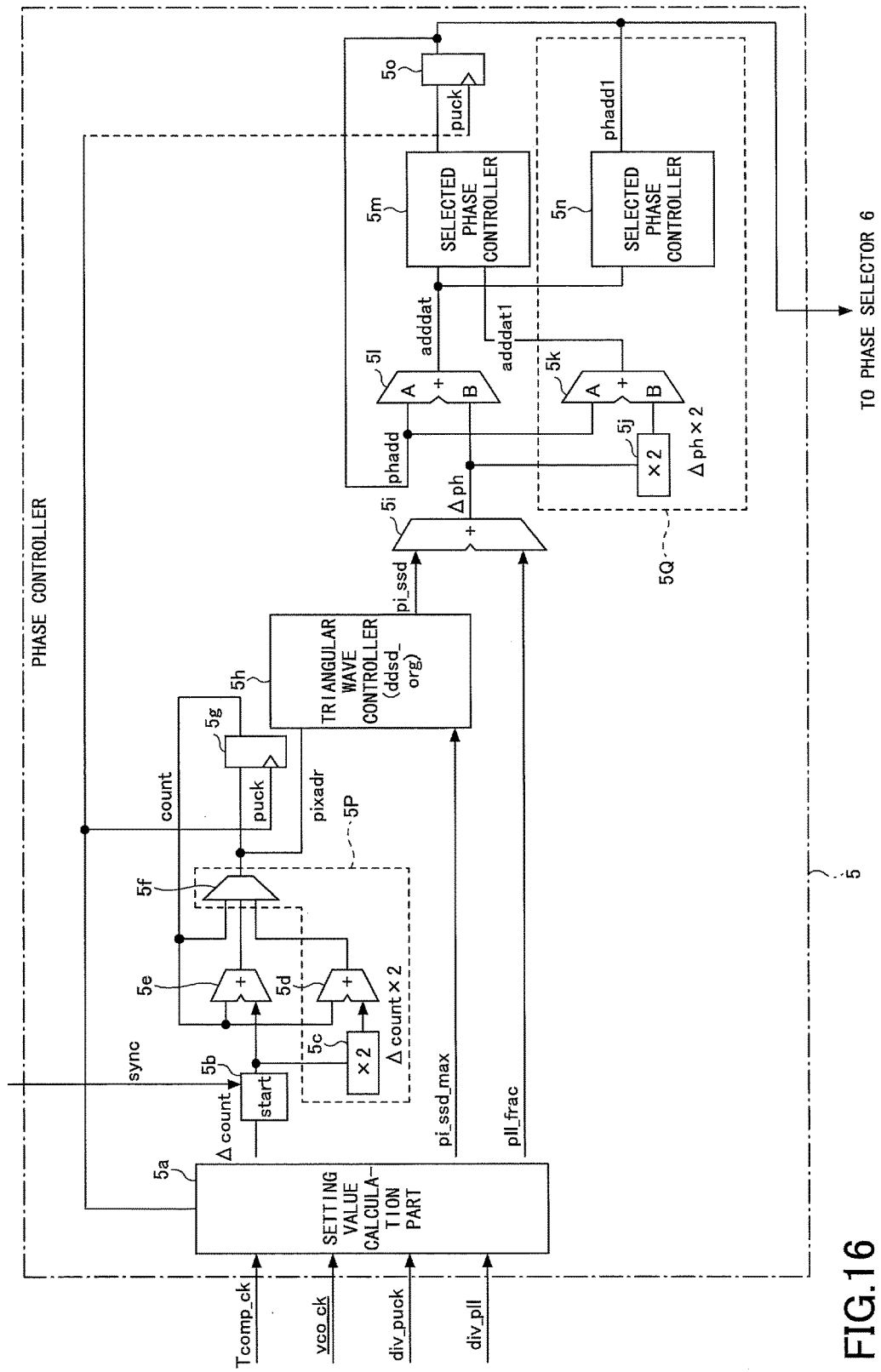
FIG. 16 is a diagram for illustrating a configuration of the phase controller in FIG. 1 and an SS modulation profile.

FIG. 15 is a diagram for illustrating phase selection out of the cycle of the feedback signal fb_ck, and a spread spectrum modulation by the phase controller 5 and the phase selector circuit 6 in FIG. 1. FIG. 16 is a diagram for illustrating a configuration of the phase controller 5 in FIG. 1 and an SS modulation profile.

Similar to FIG. 13, FIG. 15 illustrates changes of four types of parameters, and the horizontal axis is common to represent time. The four types of parameters illustrated in FIG. 13 are: (1) the count value count(n); (2) the integer part pixadr of the count value count(n); (3) the phase shift amount (the shift amount or the modulation profile) Δph; and (4) the selected phase number phadd.

In FIG. 15, three of the parameters (1) to (3) are the same as in FIG. 13, but (4) the selected phase number phadd has different values.

In FIG. 15, the vertical axis is common to (1) the count value count(n) and (2) the integer value pixadr, to designate count values (0 to 512). The vertical axis corresponding to (3) the phase shift amount Δph represents the phase shift amount of the rising edge of the phase shift clock signal pi_out from the output clock signal vco_ck. The vertical axis corresponding to (4) the phase selection number represents the phase number.

In the following, the selected phase number phadd, which is selected differently in FIG. 15 from FIG. 13, will be described.

If the selected phase number phadd designated by (4) falls below the phase lower limit as in FIG. 15, it is necessary to output the phase shift clock signal pi_out for two selected phase numbers in the cycle of the feedback signal fb_ck in one cycle before. Therefore, to generate phadd and phadd1 as in FIG. 16, the two selected phase controllers 5*m* and 5*n* are provided to generate a delay difference of one cycle.

In other words, the phase controller 5 changes the step time interval to change the phase shift amount, and the SS modulation profile to determine the shift amount of the selected phase, for cases of a case exceeding the upper limit of the phase selection; a case falling below the lower limit of the phase selection; and a case within the upper and lower limits of the phase selection, to select different phase numbers for the respective cases.

The phase shift amount (the shift amount): Δph=pi_ssd+pll_frac
The temporary selected phase number: adddat=phadd+Δph
The temporary selected phase number 1: adddat1=phadd+2×Δph
The upper limit of the phase selection: 512×(div_puck+1)
((If the number of the selected phase shift exceeds the upper limit of the phase selection)) : adddat>512×(div_puck+1)
When exceeding the upper limit of the phase selection, the count value is maintained to be the count in one puck before (the previous cycle).

$$\text{count}(p)=\text{count}(p-1) \quad \text{(Formula 35)}$$

where p is the number of puck cycles when exceeding the upper limit of the phase selection. Specifically, if the number of the selected phase shift exceeds the upper limit of the phase selection, the selected phase number is represented as in Formula 36 below, and in this case the phase shift clock signal pi_out is not output as in FIG. 14, but the phase shift clock signal pi_out of the selected phase number by Formula 37 is output in the next cycle.

If exceeding the upper limit of the phase selection, the selected phase number phadd is calculated by the following Formula 36. However, in this case, the phase shift clock signal pi_out is not output. This interval corresponds to the range BX in FIG. 15.

$$\text{phadd}(p+1)=\text{adddat}(p)-512\times(\text{div\_puck}+1) \quad \text{(Formula 36)}$$

where phadd (p+1) is a value when exceeding the upper limit of the phase selection. The selected phase number phadd in the next cycle when exceeding the upper limit of the phase selection is calculated by the following formula, and pi_out of the selected phase number phadd when exceeding the upper limit of the phase selection is output.

$$\text{phadd}(p+2)=\text{phadd}(p+1) \quad \text{(Formula 37)}$$

((Case of Selected Phase Number Falling Below the Lower Limit of the Phase Selection)) : adddat (m)<0
The count value when the selected phase number falls below the lower limit of the phase selection is the sum of the count of one cycle before (one puck before) plus twice Δcount.

$$\text{count}(m)=\text{count}(m-1)+2\times\Delta\text{count} \quad \text{(Formula 38)}$$

where m is the number of puck cycles when falling below the lower limit of the phase selection.

When falling below the lower limit of the phase selection, pi_out of the selected phase number phadd one cycle before (one puck before) by Formula 39, and pi_out of the selected phase number by Formula 40, are output.

$$\text{phadd}(m)=\text{adddat}(m-1) \quad \text{(Formula 39)}$$

$$\text{phadd1}(m)=\text{adddat}(m)+512\times(\text{div\_puck}+1) \quad \text{(Formula 40)}$$

When falling below the upper limit of the phase selection, the selected phase number phadd is calculated by the following Formula 41.

$$\text{phadd}(m+1)=\text{adddat1}(m)+512\times(\text{div\_puck}+1) \quad \text{(Formula 41)}$$

Operations are the same as in FIG. 13 in the range A when not exceeding the upper limit of the phase selection, and the range C when not falling below the lower limit of the phase selection.

Thus, changing the SS modulation profile by the state of the selected phase cancels the difference between a case exceeding the upper limit of the phase selection, and a case falling below the lower limit of the phase selection; this makes it possible not to generate an SS modulation cycle error in a state of no phase restriction.

In this way, if the degree of modulation is set such that a phase out of the cycle of the feedback clock is to be selected, the SS modulation profile is automatically changed to control selecting the phase in the cycle of the feedback clock.

This control has an effect that makes it possible to control selecting the phase in the cycle of the feedback clock even if the user does not intend to do so.

<Correlation Between Synchronization Signal and SS Modulation Waveform, and Noise>

Figure 17:
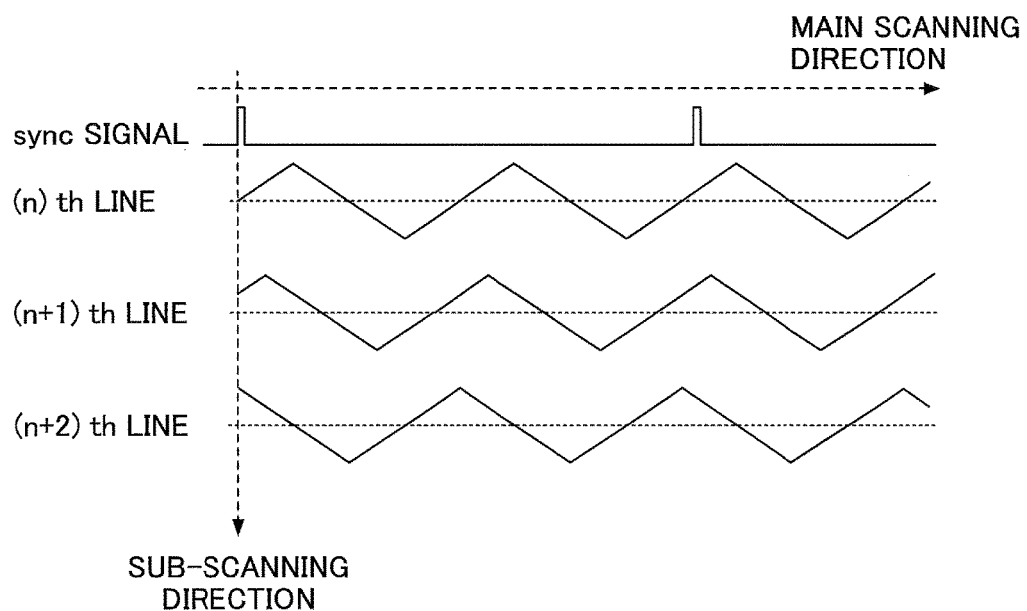
FIG. 17 illustrates a state in which a synchronization signal does not synchronize with an SS modulation waveform.

FIG. 17 illustrates a state in which a synchronization signal (sync signal) does not synchronize with an SS modulation waveform. In FIG. 17, the horizontal axis represents time, and the vertical axis represents the values of a synchronization signal (sync signal) and signals of the SS modulation waveform.

The synchronization signal (sync) is, for example, a line synchronization signal when executing a process for capturing an image in an image processing apparatus that is placed at the following stage. If the synchronization signal does not synchronize with the SS modulation cycle, the phase of the SS modulation cycle is shifted line by line, such as (n)th line, (n+1)th line, (n+2)th line, and so on. This state is a source of generating unexpected long cycle noise, which is not predictable, and hence, not correctable, and stripes may appear in a captured image.

Figure 18:
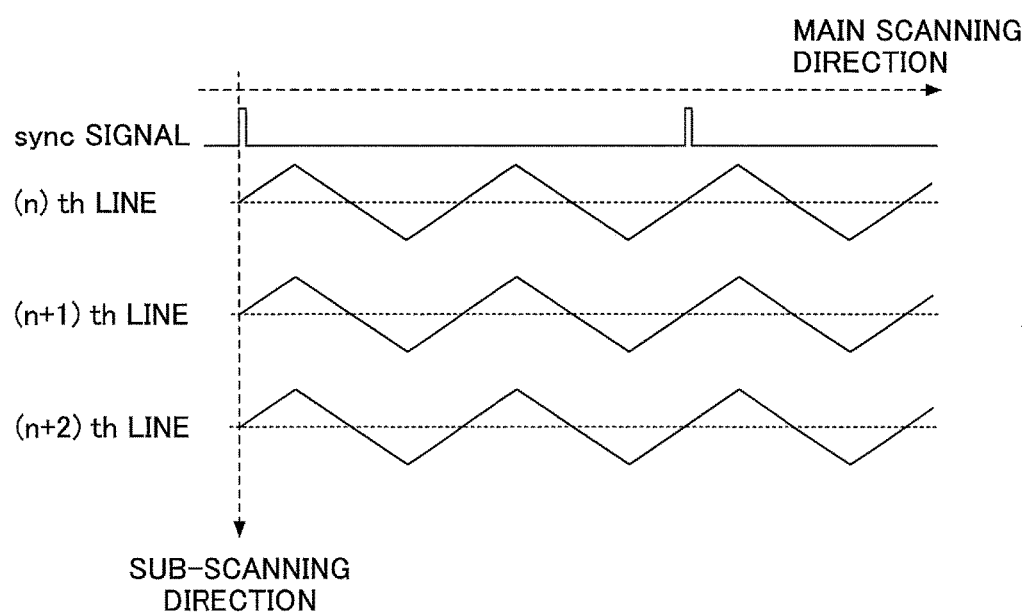
FIG. 18 illustrates a state in which an SS modulation is started with a synchronization signal, and the synchronization signal synchronizes with an integer multiple of the SS modulation cycle.
Figure 19:
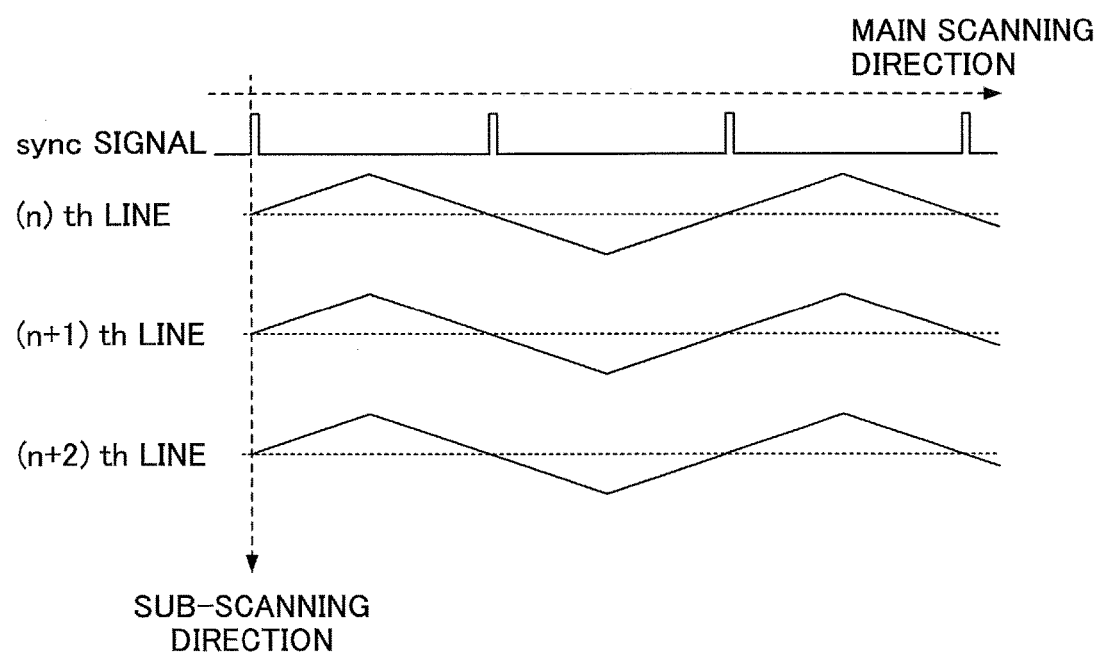
FIG. 19 illustrates a state in which an SS modulation is started with a synchronization signal, and the SS modulation cycle synchronizes with an integer multiple of the synchronization signal.

FIG. 18 and FIG. 19 illustrate states in which the synchronization signal synchronizes with the SS modulation waveform. FIG. 18 illustrates a state in which the SS modulation is started with the synchronization signal, and the synchronization signal synchronizes with an integer multiple of the SS modulation cycle. FIG. 19 illustrates a state in which an SS modulation is started with the synchronization signal, and the SS modulation cycle synchronizes with an integer multiple of the synchronization signal. In FIG. 18 and FIG. 19, the horizontal axis represents time, and the vertical axis represents the values of the synchronization signal (sync signal) and signals of the SS modulation waveform.

When synchronized at an integer multiple as in FIG. 18 and FIG. 19, the phases of the SS modulation cycles are the same for lines such as (n)th line, (n+1)th line, and (n+2)th line, and hence, long cycle noise is unlikely to be generated.

Thereupon, in the embodiment in the present disclosure, one of the cycle of the sync signal and the cycle of the SS modulation is set to a cycle of an integer multiple of the other, and the modulation starter 5*b* being the Δ value addition block starts count(n) at timing of the sync signal. This makes it possible to synchronize the SS modulation cycle with the synchronization signal as illustrated in FIG. 18 and FIG. 19.

In this way, the SSCG modulation cycle and the sync signal continue to synchronize with each other without resetting the entire SSCG circuit, and consequently, long cyclic noise due to a modulation error can be aligned.

Therefore, continuity of the SS modulation cycle can be maintained without generating an SS modulation cycle error and without resetting the circuit, and a long cycle noise error due to an SS modulation cycle error is not generated even if an SS modulation cycle error correction circuit is not provided.

Since shifting a phase by the phase shift controller certainly starts on the positive side, and control is executed to select a phase in the feedback clock cycle, the same SS modulation profile is obtained every cycle, and an SS modulation cycle error is not generated.

By such a phase shift controller, an SS modulation cycle error can be eliminated even when exceeding the upper limit of the phase selection or falling below the lower limit of the phase selection, and hence, synchronizing the SS modulation cycle with the synchronization signal can reduce unpredictable long cycle noise.

So far, the present invention has been described based on the embodiments; note that the present invention is not limited to the requirements for the embodiments described above. These points can be changed within a range of the scope of the present invention, and can be defined appropriately depending on applications.

RELATED-ART DOCUMENTS

Patent Documents

[Patent Document 1] Japanese Unexamined Patent Application Publication No. 2001-339580
[Patent Document 2] Japanese Unexamined Patent Application Publication No. 2015-103895

The present application claims priority under 35 U.S.C. § 119 of Japanese Patent Application No. 2016-050256 filed on Mar. 14, 2016, and the Japanese Patent Application No. 2016-236331 filed on Dec. 6, 2016, entire contents of which are hereby incorporated by reference.

What is claimed is:

1. A spread spectrum clock generator circuit comprising:
a phase comparator configured to detect a phase difference between an input clock signal being a reference and a feedback signal, and to output a control voltage depending on the phase difference;
a voltage-controlled oscillator configured to generate and output an output clock signal having a frequency depending on the control voltage;
a phase selector configured to select one of a predetermined number of phases equally dividing one clock cycle of the output clock signal, to generate a phase shift clock signal having a rising edge in the selected phase, and to transmit the phase shift clock signal to the phase comparator as the feedback signal; and
a phase shift controller configured to control the phase selector,
wherein the phase shift controller generates a second phase shift amount changing periodically within a predetermined range,
calculates a shift amount by adding the second phase shift amount to a first phase shift amount being a center of the shift amount predetermined from the cycle of the output clock signal, and
determines the phase of the rising edge of the phase shift clock signal to be selected by the phase selector, so as to make the cycle of the phase shift clock signal have a length changed from the cycle of the output clock signal by the shift amount,
wherein the phase selector applies a spread spectrum modulation to the output clock signal, depending on the second phase shift amount changing periodically,
wherein the phase shift controller selects the phase having been determined, and changes a setting of an SS modulation profile specifying a step time interval for changing the shift amount, and the shift amount, depending on whether a number to identify the selected phase exceeds an upper limit of the phase selection, falls below a lower limit of the phase selection, or is within the upper and lower limits of the phase selection.

2. The spread spectrum clock generator circuit according to claim 1, wherein in a case where for executing an SS modulation, for each of a predetermined number of the step time intervals step_p including an SS modulation clock being a minimum time unit to change a shift amount Δph, the shift amount Δph is changed stepwise to be changed in a triangular wave shape approximately,
representing a degree of modulation that represents a maximum change rate of the frequency of the output clock signal, by ss_amp,
representing the frequency in the step time interval step_p, by Δf_step=1/(a number of equal divisions of the output clock signal)/{(a setting value of a division ratio of an output frequency divider+1)×(a setting value of a division ratio of the phase selector circuit+1)},
a maximum value and a minimum value of the predetermined range in which the second phase shift amount changes periodically, are calculated by following formulas:

the maximum value *pi_ssd*_max=int(*ss*_amp/(the number of the equal divisions of the output clock signal×2)/Δ*f*_step), and the minimum value *pi_ssd*_min=−int(*ss*_amp/(the number of the equal divisions of the output clock signal×2)/Δ*f*_step.

3. The spread spectrum clock generator circuit according to claim 2, wherein the second phase shift amount is calculated by, introducing a count value count(n) that increments every SS modulation clock, in case of 0≤int(count(n))≤the maximum value of the second phase shift amount:

"the second phase shift amount=int(count(*n*))", in case of the maximum value of the second phase shift amount<int(count(n))≤the maximum value of the second phase shift amount+(the maximum value of the second phase shift amount−the minimum value of the second phase shift amount):

"the second phase shift amount=the maximum value of the second phase shift amount−{int(count(*n*))−the maximum value of the second phase shift amount}", and in case of the maximum value of the second phase shift amount+(the maximum value of the second phase shift amount−the minimum value of the second phase shift amount)<int(count(n))<2×(the maximum value of the second phase shift amount−the minimum value of the second phase shift amount):

"the second phase shift amount=the minimum value of the second phase shift amount+{int(count(*n*))−(2×the maximum value of the second phase shift amount−the minimum value of the second phase shift amount}".

4. The spread spectrum clock generator circuit according to claim 3, wherein in a case where the number to identify the selected phase exceeds the upper limit of the phase selection, the count value "count" is maintained to be a count in a previous cycle.

5. The spread spectrum clock generator circuit according to claim 3, wherein in a case where the number to identify the selected phase falls below the lower limit of the phase selection, the count value "count" is a count of a previous cycle added with twice Δcount, as represented by a following formula, count(*m*)=count(*m*−1)+2×{2×(the maximum value of the second phase shift amount−the minimum value of the second phase shift amount)/(an *SS* modulation cycle/a cycle of the input clock signal)}.

6. A spread spectrum clock generator circuit comprising:
a phase comparator configured to detect a phase difference between an input clock signal being a reference and a feedback signal, and to output a control voltage depending on the phase difference;
a voltage-controlled oscillator configured to generate and output an output clock signal having a frequency depending on the control voltage;
a phase selector configured to select one of a predetermined number of phases equally dividing one clock cycle of the output clock signal, to generate a phase shift clock signal having a rising edge in the selected phase, and to transmit the phase shift clock signal to the phase comparator as the feedback signal; and
a phase shift controller configured to control the phase selector,
wherein the phase shift controller generates a second phase shift amount changing periodically within a predetermined range,
calculates a shift amount by adding the second phase shift amount to a first phase shift amount being a center of the shift amount predetermined from the cycle of the output clock signal, and
determines the phase of the rising edge of the phase shift clock signal to be selected by the phase selector, so as to make the cycle of the phase shift clock signal have a length changed from the cycle of the output clock signal by the shift amount,
wherein the phase selector applies a spread spectrum modulation to the output clock signal, depending on the second phase shift amount changing periodically,
wherein shifting the phase by the phase shift controller starts certainly on a positive side, and control is executed to select a phase in a clock cycle of the feedback signal.

7. The spread spectrum clock generator circuit according to claim 6, wherein the phase shift controller controls the phase in the clock cycle of the feedback signal, based on a cycle of the input clock into the phase comparator, a division ratio of the clock of the feedback signal, an SS modulation cycle, and a degree of modulation.

8. The spread spectrum clock generator circuit according to claim 6, wherein in a case where the degree of modulation is set such that a phase out of the cycle of the feedback clock is to be selected, the phase shift controller changes the degree of modulation automatically so as to control selecting a phase in the feedback clock cycle.

9. The spread spectrum clock generator circuit according to claim 1, wherein an SS modulation cycle is an integer multiple of a cycle of a predetermined synchronization signal, or the cycle of the predetermined synchronization signal is an integer multiple of the SS modulation cycle, and an SS modulation starts with the predetermined synchronization signal.

* * * * *